United States Patent [19]

Shoji et al.

[11] Patent Number: 5,303,263
[45] Date of Patent: Apr. 12, 1994

[54] TRANSMISSION CHANNEL CHARACTERISTIC EQUALIZER

[75] Inventors: Yasuo Shoji; Haruhiro Shiino; Norio Yamaguchi; Masami Abe, all of Tokyo, Japan

[73] Assignee: Oki Electric Industry Co., Ltd., Tokyo, Japan

[21] Appl. No.: 904,337

[22] Filed: Jun. 24, 1992

[30] Foreign Application Priority Data

| Jun. 25, 1991 | [JP] | Japan | 3-153545 |
| Jun. 25, 1991 | [JP] | Japan | 3-153561 |
| Jul. 29, 1991 | [JP] | Japan | 3-188590 |
| Jul. 29, 1991 | [JP] | Japan | 3-188591 |
| Oct. 14, 1991 | [JP] | Japan | 3-264566 |

[51] Int. Cl.$^5$ ............................................. H03H 7/30
[52] U.S. Cl. ........................................ 375/11; 375/94; 371/43
[58] Field of Search .................... 375/12, 14, 18, 94, 375/96, 101, 39, 99, 11, 4; 371/43, 44, 45

[56] References Cited

U.S. PATENT DOCUMENTS

| 4,833,693 | 5/1989 | Eyuboglu | 375/14 |
| 4,862,481 | 8/1989 | Dzung | 375/94 |
| 5,090,025 | 2/1992 | Marshall et al. | 375/4 |
| 5,099,499 | 3/1992 | Hammar | 375/94 |
| 5,164,961 | 11/1992 | Gudmundson | 375/11 |

OTHER PUBLICATIONS

John G. Proakis, *Digital Communications*, McGraw-Hill, Inc., 2nd ed., 1989, pp. 610–643.
Gottfied Ungerboeck, "Adaptive Maximum-Likelihood Receiver for Carrier-Modulated Data-Transmission ystems", *IEEE Transactions on Communications*, May 1974 pp. 624–636.

*Primary Examiner*—Stephen Chin
*Attorney, Agent, or Firm*—Spencer, Frank & Schneider

[57] ABSTRACT

An equalizer including a channel estimator allowing a Viterbi algorithm processor to estimate transmitted symbols accurately, so that the impulse response of a transmission channel may not deviate from the correct one. The equalizer outputs an transmitted symbol sequence estimate having the largest path metric by correcting the channel impulse response by parameter coefficients of the LMS (Least Mean Square) or RLS (Recursive Least Square) algorithm, by compensating for phase fluctuations due to the frequency offset and phase jitter of received signals, or by using a sequence included in an intermediate portion of a TDMA (Time Division Multiple Access) frame format.

17 Claims, 16 Drawing Sheets

TRANSMISSION CHANNEL CHARACTERISTIC EQUALIZER

BACKGROUND OF THE INVENTION

1. Field of the Invention

The present invention relates to an equalizer incorporated in, for example, a receiver for digital communication for equalizing a transmission channel or the characteristic of a transmission channel. More particularly, the present invention is concerned with an optimum sequence estimator applicable to, for example, a Viterbi algorithm processor, an equalizer of the type recovering a transmitted signal accurately by correcting distortions particular to a transmission channel, or a phase compensation type equalizer which effects equalization while correcting phase fluctuations ascribable to the offset of the carrier frequency.

2. Description of the Prior Art

One of the conventional equalizing technologies for the above application is disclosed in, for example, J. G. Proakis, "Digital Communications", MacGraw-Hill, 1983, pp. 548–554, 610–616, 624–627, and 642–648.

Today, digital radio communication, including digital mobile communication, is making remarkable progress. It is a common practice with digital radio communication to code a digital signal which is a sequence of ZEROs and ONEs on a several bits basis, modulate the coded signals, or symbols, by radio frequency, and transmit the modulated symbols. This is desirable from the standpoint of efficient use of limited ordinary frequencies. A transmission channel for digital radio communication suffers from reflection, diffraction, scattering and multipath propagation of electromagnetic waves and, when the communicating station is mobile the transmission channel also suffers from fading due to Doppler frequencies. Moreover, white noise whose major component is thermal noise is added to the above-mentioned harm in, for example, a transmitter and a receiver. Fading and white noise introduce errors in demodulated symbols in a receiver due to, among others, intersymbol interference. Usually, intersymbol interference on the same channel is far greater than intersymbol interference ascribable to nearby channels.

Since intersymbol interference noticeably distorts the waveform of a received signal, it is necessary to correct the distortion by an equalizer. An optimum sequence estimation system for implementing an equalizer is one of the most effective equalization schemes elaborated to recover transmitted data accurately out of a received signal waveform which has been distorted by the delay characteristic of a transmission channel.

A digital mobile communication system will be outlined with reference to FIGS. 2A, 2B, 3 and 4. Future digital mobile communication systems are expected to use a TDMA (Time Division Multiple Access) scheme to promote efficient use of the limited frequency band and to readily adapt to ISDN (Integrated Services Digital Network). FIGS. 2A and 2B each shows a different TDMA frame format according to the North American standards by way of example. In FIG. 2A, one frame is made up of six time slots Slots 1–6, and one or two time slots are assigned to a single subscriber. The time slots Slots 1–6 each has a 28-bit training sequence SYNC for synchronization and the training of an equalizer, a 12-bit control information sequence SACCH, a 12-bit sequence CDVCC for the discrimination of nearby channels, a 60-bit data field DATA, and a 12-bit reserved field RSVD In FIG. 2B, a TDMA frame is constituted by six to approximately eight time slots Slot 1–n, and one or two time slots are assigned to a single subscriber, a training sequence TR which has a plurality of bits which precedes a multi-bit data sequence DA for allowing an equalizer to estimate the impulse response of a transmission channel.

As shown in FIG. 3, a conventional digital mobile communication system includes a transmitter 10 for transmitting a signal $S_c(t)$ in response to input data bm, and a receiver 30 for receiving the signal $S_c(t)$ over a transmission channel 20. The transmitter 10 is made up of an encoder 11, a low-pass filter (LPF), and a modulator 13 while the receiver 30 is constituted by a demodulator 31, a LPF 32, an equalizer 33, and a decoder 34. Specifically, in the transmitter 10, the encoder 11 transforms the input data $b_m$ to symbols $x_n$ to be transmitted. The LPF 12 generatings a complex baseband signal s (t) by filtering the symbols $X_n$, and delivers the signal s (t) to the modulator 13. The modulator 13 modulates the signal s (t) by a carrier having a frequency of fc and sends the resulting modulated signal $S_c(t)$ to the receiver 30 over the transmission channel 20. In the receiver 30, the demodulator 31 synchronously detects a signal $r_c(t)$ propagated through the channel 20 using the same frequency as the transmission carrier frequency fc, thereby converting the signal $r_c(t)$ to a complex baseband signal r (t). Further, the LPF 32 filters the signal r (t) to produce a received complex baseband signal y (t). The signal y (t) is sampled at a symbol interval of T.

The phase of the received signal fluctuates due to the offset between the transmission carrier frequency and the demodulation frequency of the receiver 30 as well as to phase jitter. The equalizer 33, therefore, compensates for the change in the characteristic of the transmission channel 20 due to frequency-selective fading and estimates the transmitted symbol on the basis of the sample value of the signal y (t). Finally, the decoder 34 decodes the estimate $Ex_n$ (where E stands for estimation) of the transmitted symbol to thereby produce transmitted data $Eb_m$. According to the North American standards, for example, the encoder 11 is implemented with a differential $\pi/4$ phase shift keying (DQPSK) modulation scheme. The DQPSK scheme divides a binary data sequence $b_m$ of ZEROs and ONEs by each two bits and assigns one of the phase differences $-3\pi/4$, $-\pi/4$, $\pi/4$ and $3\pi/4$ to each of the four different combinations of ZERO and ONE. Assuming that the assigned phase difference is $\Delta\Phi_n$ (n=1, 2, . . .) and that the absolute phase of a transmitted symbol at a time n is $\Phi_n$, then the DQPSK system generates a transmitted symbol $X_n$ by the following equations:

$$\Phi_n = \Phi_{n-1} + \Delta\Phi_n \qquad (1.1)$$

$$X_n = e^{j\Phi_n} \qquad (1.2)$$

As a result, the input data $b_m$ are converted to points on a signal space particular to the DQPSK system, as shown in FIG. 4. In FIG. 4, the symbol "+" with a circle and the symbol "×" with a circle are representative of an odd symbol and an even symbol, respectively. The phase transition from a given time n to the next time n+1 is one of $-3\pi/4$, $-\pi/4$, $\pi/4$ and $3\pi/4$.

Hereinafter will be described the optimum sequence estimation procedure taught in the previously mentioned document. Briefly, assuming that a received signal sequence $y_n = \{y_1, y_2, \ldots, y_n\}$ was obtained in a given finite period, the optimum sequence estimation estimates a transmitted symbol sequence $x_n = \{x_1, x_2, \ldots, x_n\}$ which most probably realizes $y_n$, considering that the impulse response h (t) of the transmission channel is known. Assuming Gaussian white noise as transmission channel noise, the most probable sequence can eventually be determined in terms of a sequence $\{x_1, x_2, \ldots, x_n\}$ which maximizes:

$$- \sum_{k=1}^{N} \left| y - \sum_{j} x_j h(t - jT) \right|^2 \quad (2)$$

The above equation (2) can be efficiently solved if use is made of the Viterbi algorithm known as a method of decoding convolutional code.

The principle of the Viterbi algorithm available for the estimation of the most probable sequence will be outlined with reference to FIG. 5 which models the transmission channel of FIG. 3. Assume a discrete time model of FIG. 5 which is representative of a transmission channel with a finite impulse response. As shown, the model includes delay elements 40 each effecting a delay equal to the symbol interval T, multipliers 41, an accumulator 42, and an adder 43. Labeled $h_j (j=0, \ldots, L)$ is a sample value $h(t-jT)$ of the impulse response $h(t)$ of the transmission channel 20, inclusive of LPFs 12 and 13 (FIGS. 3), sampled at the symbol interval T; the impulse response has a length of $(L+1)$ T. Labeled $w_n$ is noise particular to the transmission channel, i.e., additive Gaussian white noise. Then, the equation (2) is rewritten as:

$$- \sum_{k=1}^{N} \left| y_k - \sum_{j=0}^{L} x_{k-j} h_j \right|^2 \quad (3)$$

Therefore, the sum $j_n$ up to $k=n$ of the equation (3) may be expressed by using the sum $j_{n-1}$ up to $k=n-1$, as follows:

$$j_n = j_{n-1} - \left| y_n - \sum_{j=0}^{L} x_{n-j} h_j \right|^2 \quad (4)$$

where $j_n$ is a quantity proportional to the logarithmic probability of the received signal sequence, i.e., $k=1$ to n, and is referred to as a path metric. On the right side of the equation (4), the second term is a quantity proportional to a logarithmic probability associated with state transition, which will be described, and referred to as a branch metric.

On the other hand, the state of the channel model shown in FIG. 5 at a time $n-1$ is represented by a vector of states, as follows:

$$S_{n-1} = \{x_{n-1}, \ldots, x_{n-1}\} \quad (5)$$

Regarding the DQPSK scheme, the transmission channel assumes any one of $4^L$ states in total.

Assuming the transition from a state $S_{n-1}$ at a time $n-1$ to a state $S_n$ at a time n, then four different transitions may occur from the state $S_{n-1}$ for each of $4^L$ states $S_n$. Assuming DQPSK of $\pi/4$ differential and $L=1$, FIG. 6 illustrates the transitions of a channel state with respect to time, i.e., a so-called trellis diagram. In FIG. 6, numerals 0, 1, 2 and 3 are representative of four different probable states while numerals given to the individual states at each particular time correspond to the numbers assigned to the transmitted symbols shown in FIG. 4. The state transition between consective times is called a branch, and $4^n$ routes tracking the states are called paths.

For each of the four probable states at each time shown in FIG. 6, paths from four different states at the immediately preceding time exist. The Viterbi algorithm calculates a path metric represented by the equation (4) with each of the four probable paths in each state at each time, and then selects one of the paths having the largest path metric. As a result, $4^L$ different paths survive at each time instant, and the past paths are sequentially converged to a single path. An estimate of the transmitted symbol sequence is obtained from a single surviving path.

FIG. 7 shows a specific construction of the conventional equalizer using the optimum sequence estimation scheme stated above. As shown, the equalizer is made up of a matched filter 50, a Viterbi algorithm processor 51, and a channel estimator 52. Sample values $y_n$ of a received signal are applied to the Viterbi algorithm processor 51 and channel estimator 52. In response, the channel estimator 52 estimates the impulse response of the transmission channel by using the training sequence (SYNC, FIG. 2A) and the sample value $y_n$ of a received signal corresponding to the training sequence and on the basis of LMS (Least Mean Square) or a similar adaptive algorithm. Thereafter, the channel estimator 52 repeats impulse response estimation by use of $y_n$ and the estimate $Ex_n$ of a transmitted symbol. The estimated impulse response of the transmission channel $\{Eh_j\}$ $(j=0, \ldots, L)$ is fed to the Viterbi algorithm processor 51. Then, the processor 51 estimates a transmitted symbol by using the sample value $y_n$ of the received signal and the impulse response estimate $\{Eh_j\}$ in accordance with the previously stated principle.

A specific construction of the channel estimator 52 of FIG. 7 is shown in FIG. 8. As shown, the channel estimator 52 includes a switch 101 having contacts 101a and 101b for selecting either of the training sequence TR and the transmitted symbol sequence estimate $Ex_{n-M}$. A switch 102 has contacts 102a and 102b and selects either of a received signal $y_n$ and a delayed received signal $y_{n-M}$. A delay circuit 103 is implemented as a register and delivers the delayed received signal $y_{n-M}$ to the contact 102b by delaying the received signal $y_n$. A plurality of registers (T) 110-0 to 110-L are connected to the switch 101 in a cascaded configuration for storing the training sequence TR or the transmitted symbol sequence estimate $Ex_{n-M}$. The outputs of the registers 110-0 to 110-L are respectively connected to multipliers 111-0 to 111-L, registers 112-0 to 112-L for storing impulse response estimates, adders 113-0 to 113-L, and multipliers 114-0 to 114-L. The outputs of the multipliers 111-0 to 111-L are connected to the input of an adder 120. The output of the adder 120 and the switch 102 are connected to the input of a subtractor 121. The output of the subtractor 121 and a positive constant $\beta$, called the step size, are connected to the input of a multiplier 122 whose output is in turn connected to the inputs of the multipliers 114-0 to 114-L.

In operation, the switches 101 and 102 select their contacts 101a and 102a first. In this condition, the multipliers 111-0 to 111-L and adder 120 produce an estimate $Ey_n$ of a received signal represented by the equation (3) from a training symbol $x_n$ at a time n, a training sequence $\{x_{n-1}, \ldots, x_{n-L}\}$ at the time n stored in the registers 110-0 to 110-L, and estimates of impulse responses $h_j^{n-1}$ (j=0, 1, ..., L) of the transmission path at a time n−1 stored in the registers 112-0 to 112-L, as follows:

$$Ey_n = \sum_{j=0}^{L} x_{n-j} \cdot Eh_j^{n-1} \quad (6)$$

The subtractor 121 subtracts the estimate $Ey_n$ of the received signal from the received signal $y_n$ to produce an estimation error $ER_n$ by the following equation:

$$ER_n = y_n - Ey_n \quad (7)$$

Subsequently, the adders 113-0 to 113-L and multipliers 114-0 to 114-L and 122 cooperate to update the impulse response estimate of the transmission channel at the time n−1 according to the following equation:

$$Eh_j^n = Eh_j^{n-1} + \beta \cdot ER_n \cdot x^*_{n-1} \quad (8)$$

where j is 0, 1, ..., L, the asterisk indicates complex conjugate, and $\beta$ indicates a positive constant called the step size.

The updated estimates produced by the equation (8) are stored in the registers 112-0 to 112-L as estimates $Eh_j^n$ at a time n. After the training, the impulse response of the transmission channel is also estimated in the data field (data sequence DA) in order to follow changes of the channel path due to fading. At this instant, the switches 101 and 102 select the contacts 101b and 102b, respectively. In this condition, the Viterbi algorithm processor 40 executes processing similar to the training by use of the estimate $Ex_{n-M}$ obtained from the path portion up to a time n−M which converged at the time n, and the received signal $y_{n-M}$ delayed M symbol intervals by the delay circuit 103, thereby continuously estimating the impulse response of the transmission channel.

The adaptive algorithm represented by the equation (8), i.e., the LMS algorithm is extensively used since it is simple, although convergence is relatively slow. The RLS (Recursive Least Square) algorithm is high in both of convergence speed and estimation accuracy and will be described hereinafter. Let the impulse response vector of the transmission channel path at a time n and the vector of partial sequence of transmitted symbols be respectively defined by the following equations (9) and (10):

$$EBh_n = \{Eh_0^n, Eh_1^n, ..., Eh_L^n\}^T \quad (9)$$

$$Bx_n = \{x_n, x_{n-1}, ..., x_{n-L}\}^T \quad (10)$$

where E stands for estimation, and B and T indicate respectively a vector and the transposition of a vector.

Then, the RLS algorithm estimates the impulse response by the following procedure:

$$Bk_n = BP_{n-1} \cdot Bx_n^* (Bx_n^T \cdot BP_{n-1} \cdot Bx_n^* + \lambda)^{-1} \quad (11)$$

$$BP_n = (BP_{n-1} - Bk_n \cdot Bx_n^T \cdot BP_{n-1})/\lambda \quad (12)$$

$$EBh_n = EBh_{n-1} + Bk_n \cdot ER_n \quad (13)$$

where $\lambda$ is a forgetting factor, $BP_n$ is the covariance matrix of error signals $ER_n$, and $Bk_n$ is a vector of Kalman gains.

In practice, the above-described RLS algorithm is rarely applied to the channel estimation of an optimum sequence estimator since it involves an extremely great number of calculations associated with a matrix.

Referring to FIG. 9, a conventional optimum sequence estimator applicable to the equalizer 33 of FIG. 3 is shown and implemented by independent ICs or similar circuits or by program control using a processor, as the case may be. As shown, the estimator has a phase rotating section 40, delay means 50, a Viterbi algorithm processor 60, a channel estimator 70, and a phase estimator 80. In FIG. 9, solid lines, dash-and-dot lines and dash-and-dots lines connecting the blocks represent real numbers, complex numbers, and complex vectors, respectively. The phase rotating section 40 has computing means 41 and multiplying means 42 and rotates, based on a phase estimate $E\phi_n$, the phase of the sample value $y_n$ of a received signal to thereby produce a sample value $cr_n$ (c stands for compensation) free from a phase fluctuation ascribable to frequency offset and phase jitter. The delay means 50 compensates for the delay of decision particular to the Viterbi algorithm, i.e., delays the sample value $cr_n$ of a received signal a predetermined period of time, and feeds the delayed value $cr_{n-M}$ to the channel estimator 70 and phase estimator 80. The Viterbi algorithm processor 60 receives the sample value $cr_n$ and estimates a transmitted symbol by the Viterbi algorithm on the basis of an impulse response estimate $Eh_j$ of the transmission channel 20 produced by the channel estimator 70, thereby outputting a transmitted symbol sequence estimate $EX_{n-M}$. Since the actual impulse response of the transmission channel 20 is unknown, the channel estimator 70 estimates it and delivers an impulse response estimate $Eh_j$ to the Viterbi algorithm processor 60. The channel estimator 70 is made up of received signal reconstructing means or section 71, adaptive impulse response updating means or section 72, and subtracting means 73. The received signal reconstructing means 71 produces an estimate $Er_n$ of a received signal from the transmitted symbol sequence estimate $\{EX_n, EX_{n-1}, ..., EX_{n-L}\}$ and the impulse response estimate $Eh_j$ of the transmission channel 20, as follows:

$$Er_n = \sum_{j=0}^{L} EX_{n-j} \cdot Eh_j^n \quad (14)$$

The subtracting means 73 subtracts the estimate $Er_n$ from the received signal $cr_n$ whose phase fluctuation has been compensated for to thereby produce an error signal $e_n$:

$$e_n = cr_n - Er_n \quad (15)$$

The adaptive impulse response updating means 72 updates the impulse response estimate $Eh_j$ (j=0, 1, ..., L) of the transmission channel 20 by the LMS algorithm expressed as:

$$Eh_j^{n+1} = Eh_j^n + \beta \cdot e_n \cdot EX^*_{n-j} \quad (16)$$

where j is 0, 1, ..., L, and asterisk and $\beta$ denote respectively the complex conjugate and a positive constant or step size.

The phase estimator 80 estimates a phase variation due to frequency offset and jitter by the following equation:

$$E\phi_{n+1} = E\phi_n + a \cdot Im[e_n \cdot cr^*_n] \quad (17)$$

where Im [ ] and $\alpha$ indicate respectively the imaginary portion of a complex number and a positive constant.

The resulting phase estimate $E\phi_{n+1}$ is fed from the phase estimator 80 to the phase rotating section 40 to cause the latter to compensate for the phase variation. The compensation effected by the phase estimator 80 and phase rotating section 40 is equivalent to a first-order phase locked loop (PLL). In this sense, the phase estimator 80 may be considered a combination of a phase error detecting circuit 81, a loop filter 82 and a voltage controlled oscillator (VCO) 83 constituting a phase locked loop. The phase error detecting circuit 81 is made up of a complex conjugate computing means 81a for producing the complex conjugate $cr^*_{n-m}$ of the output $cr_{n-m}$ of the delay means 50, multiplying means 81b for multiplying the complex conjugate $cr^*_{n-m}$ and the estimation error $e_{n-m}$, and imaginary portion extracting means 81c for extracting the imaginary portion from the result of the multiplication to thereby produce a phase error $\Delta\phi_n$. The voltage controlled oscillator 83 is constituted by adding means 83a for adding the phase estimate $E\phi_{n-1}$ of the previous instant to the output of the multiplying means 82a, and delay means 83b for delaying the output of the adding means 83a and implemented as, for example, a register.

The conventional optimum sequence estimator uses the LMS algorithm, which is slow in convergence, even in estimating the impulse response of the transmission channel by the training sequence TR. This brings about the drawback that even when the estimate of impulse response of the transmission channel is not converged to a correct value, the estimator has to execute Viterbi algorithm processing and is, therefore, apt to fail to estimate an optimum sequence. On the other hand, the RLS algorithm will allow the estimate of impulse response of the transmission channel based on the training sequence TR to converge rapidly to a correct value. However, such a scheme is difficult to practice since, in the data portion (data sequence DA), not only does the Viterbi algorithm itself involve a relatively great amount of computation but also the estimation of the transmission channel needs an extremely great amount of computation.

Regarding digital cellular communication or similar mobile radio communication, frequency-selective fading occurs due to the movement of a communicating station, in addition to reflection, diffraction, scattering and multipath propagation. Therefore, a transmission channel is not uniformly time-varying with the result that errors are introduced in the impulse response estimate $\{Eh_j\}$ in the channel estimator 52, FIG. 7. Consequently, an estimation error occurs in the estimated transmitted symbol sequence $\{Ex_n\}$ from the Viterbi algorithm processor 51, aggravating the error probability of the equalizer. A promising implementation against this kind of error has not been reported yet.

Since the compensation for a phase variation is effected by a first-order phase locked loop, as stated earlier, it is impossible to sufficiently compensate for, among the phase variations ascribable to frequency offset and phase jitter, the regular phase rotation due to frequency offset. Therefore, the error probability increases with the increase in frequency offset. This limits the allowable range of frequency offset and, therefore, obstructs accurate decoding.

SUMMARY OF THE INVENTION

It is therefore an object of the present invention to provide an optimum sequence estimator capable of compensating for a phase variation over a broad range of frequency offset and thereby insuring accurate estimation of transmitted symbols using the Viterbi algorithm.

It is another object of the present invention to provide an optimum sequence estimator which promotes rapid convergence of an estimated impulse response of a transmission channel with a minimum amount of computation.

An equalizer in accordance with the present invention comprises a matched filter connected to a memory for maximizing the signal-to-noise (S/N) ratio of sample values $y_n$ of a received signal temporarily stored in and outputted from the memory, a Viterbi algorithm processor connected to the matched filter for producing, on receiving a sample value $y_n$ having the highest S/N ratio, estimates of transmitted symbols out of the received signal according to the Viterbi algorithm and on the basis of an impulse response estimate of a transmission channel, and a channel estimator connected at the input thereof to an output of the memory and an output of the Viterbi algorithm processor and connected at the output thereof to the Viterbi algorithm processor and matched filter. The channel estimator comprises a plurality of delay elements, a plurality of multipliers, a plurality of adders, and a computing section for updating, on receiving either of a training sequence and the estimates of transmitted symbols together with the received signal, the impulse response of the transmission channel by an adaptive algorithm and delivering an impulse response estimate of the channel to the Viterbi algorithm processor.

Also, an equalizer of the present invention comprises a phase rotating section for rotating, on receiving a sample value of a received signal, the phase of the received signal on the basis of a phase estimate to thereby compensate for a phase fluctuation, a Viterbi algorithm processor connected to the phase rotating section for estimating, on receiving the compensated received signal, a transmitted symbol according to the Viterbi algorithm on the basis of an impulse response estimate of a transmission channel to thereby output a transmitted symbol sequence estimate, a delaying section connected to between the phase rotating section and the Viterbi algorithm processor for delaying the sample value of the received signal, a phase estimator comprising a voltage controlled oscillator, a multiplying section connected to the voltage controlled oscillator, and a phase error detecting circuit connected to the multiplying section, and a channel estimator connected to the phase error detecting circuit and delaying section and to the Viterbi algorithm processor and an output thereof.

BRIEF DESCRIPTION OF THE DRAWINGS

The objects and features of the present invention will become more apparent from a consideration of the following detailed description taken in conjunction with the accompanying drawings in which.

DESCRIPTION OF THE PREFERRED EMBODIMENTS

Figure 3:
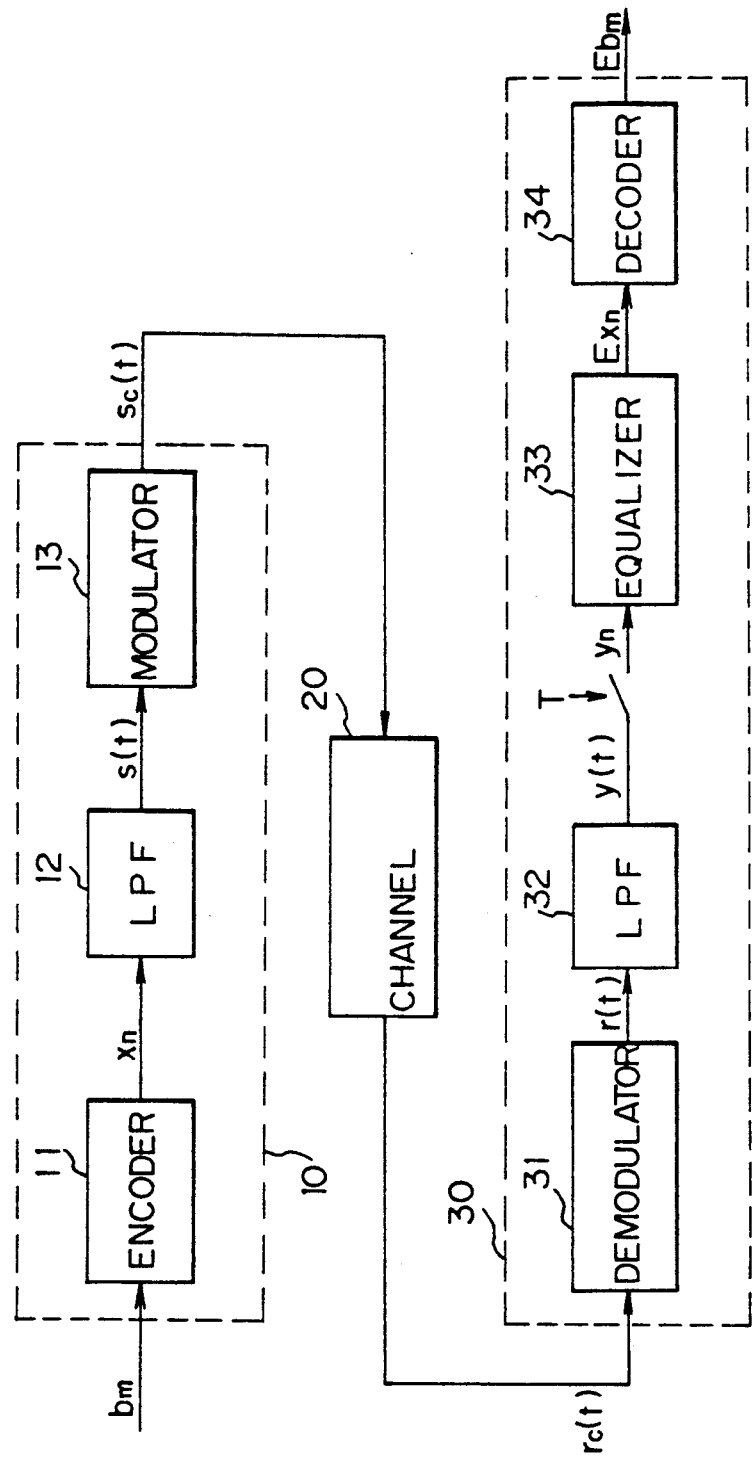
FIG. 3 shows a transmitter and a receiver implementing a conventional digital mobile communication system.
Figure 4:
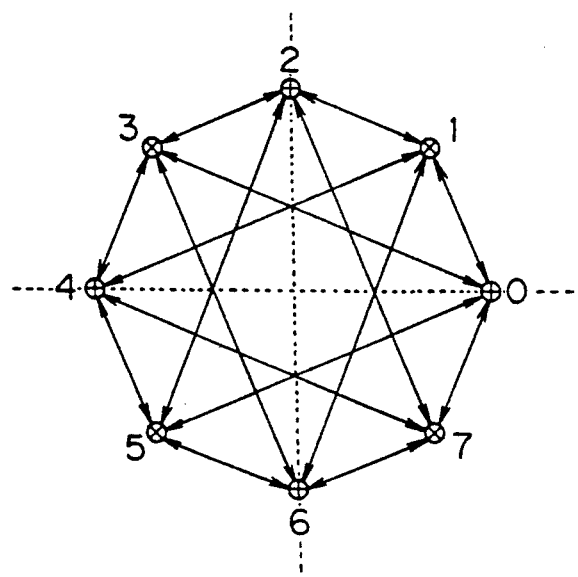
FIG. 4 is a signal space diagram particular to a differential $\pi/4$ PSK (DQPSK) scheme.
Figure 5:
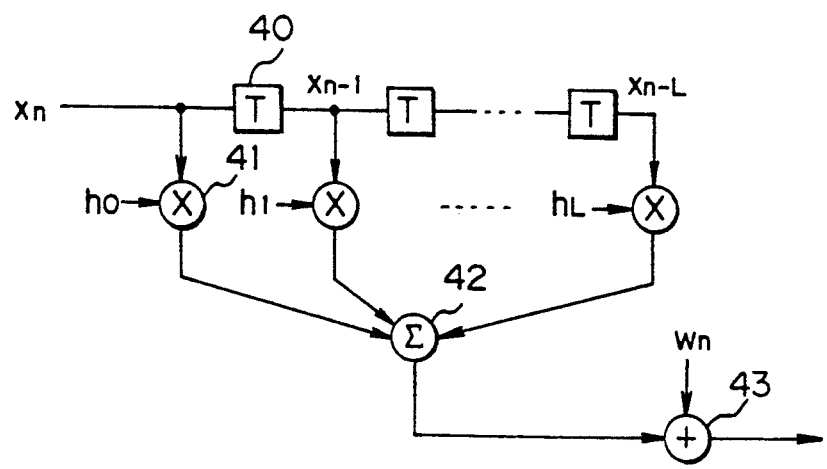
FIG. 5 is a diagram modeling a transmission channel shown in FIG. 3.
Figure 6:
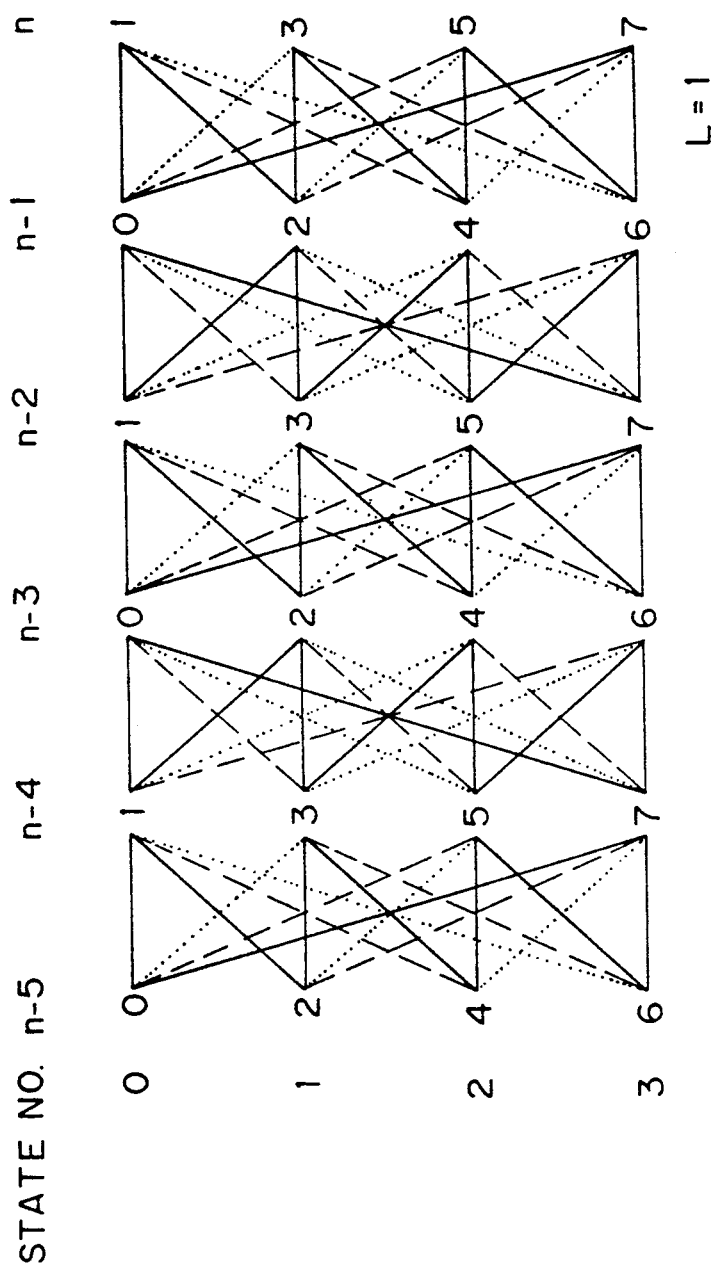
FIG. 6 is a trellis diagram associated with FIG. 5.
Figure 7:
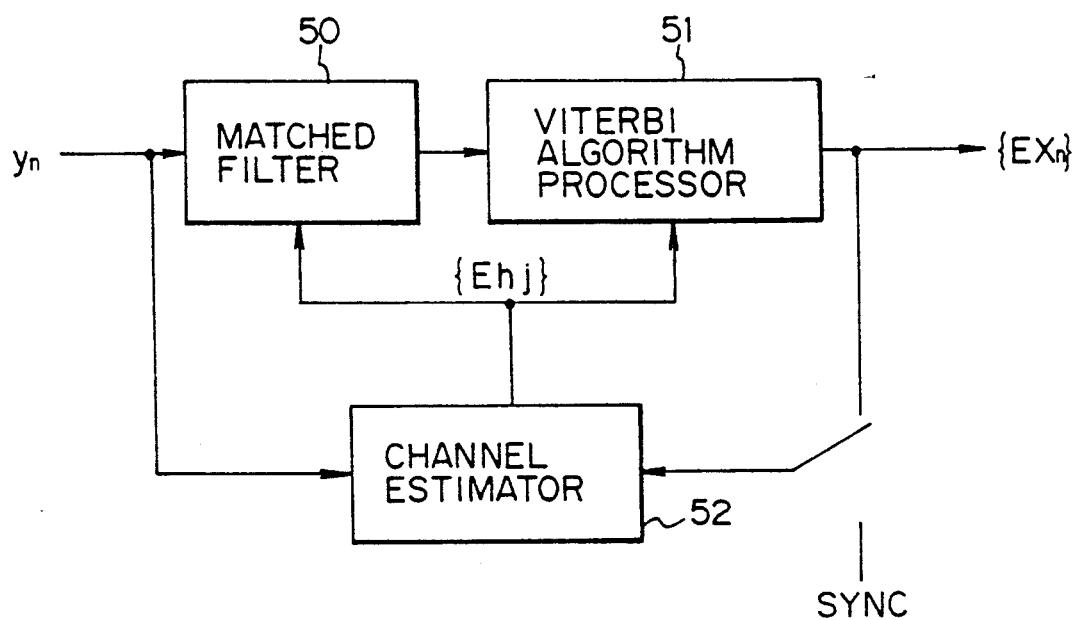
FIG. 7 is a block diagram schematically showing the construction of an equalizer included in the receiver of FIG. 3.

FIGS. 1A, 1B, 1C, 1D, 1E and 10 each shows a preferred embodiment of the equalizer in accordance with the present invention which may be substituted for the equalizer 33 of the receiver 30, FIG. 3. As shown, the embodiments each has a memory 130 for temporarily storing the sample values $y_n$ of received signals. A matched filter 145 is connected to the output of the memory 130 for maximizing the S/N (Signal-to-Noise) ratio of the received signals. A Viterbi algorithm processor 160A, 160B or 160C is connected to the output of the matched filter 145 for producing an estimate $Ex_n$ of a transmitted symbol by using the sample value $y_n$ of the received signal and an estimated impulse response $\{Ehj\}$ (j=0, ..., L) of a transmission channel. Also connected to the output of the matched filter 145 is a channel estimator 170A, 170B or 170C for estimating the impulse response $\{Ehj\}$ of the transmission channel by using a training sequence and corresponding sample values $y_n$ of received signals. Each embodiment further includes independent circuits implemented as LSIs (Large Scale Integrated Circuits) or program control implemented by the processor.

The Viterbi algorithm processor 160A, 160B or 160C estimates an optimum sequence according to the previously stated Viterbi algorithm. The processors 160A–160C each has branch metric calculator 161 to which the samples values $y_n$ of received signals are applied from the matched filter 145. A path metric calculator 162 and a path memory 164 are connected to the branch metric calculator 161. A path conversion decision device 165 and first and second counters 166 and 167, respectively, are connected to the path memory 164. Further connected to the path memory 164 is an intermediate path processor 168. An intermediate path memory 169 is connected to the intermediate path processor 168. The memories 164 and 169 are each implemented as a RAM (Random Access Memory) or similar semiconductor memory.

Figure 1A:
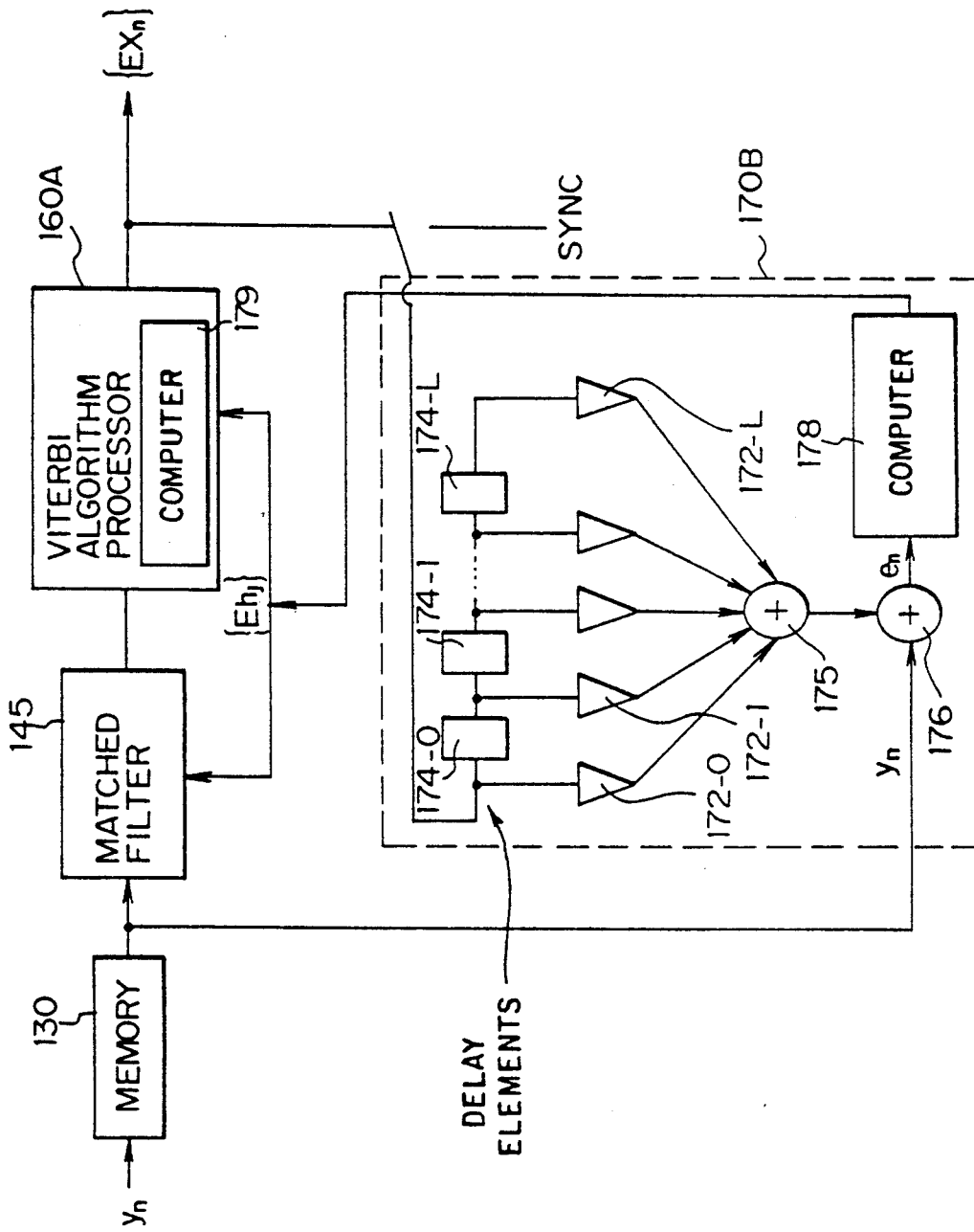
FIG. 1A is block diagram schematically showing a first embodiment of the equalizer in accordance with the present invention.

In a first embodiment shown in FIG. 1A, the channel estimator 170B uses the LMS or RLS algorithm and receives the sample values $y_n$ of received signals from the memory 130. In the data period DATA or the control information symbol period (SACCH or CDVCC), FIG. 2A or 2B, the channel estimator 170B executes equalization a plurality of times every time slot or every plurality of symbols by using a plurality of correction coefficients $\beta$ or forgetting factors $\lambda$ based on the LMS or RLS algorithm. Here, the number of times of equalization is equal to the number of correction coefficients $\beta$ or forgetting factors $\lambda$, and the same correction coefficient $\beta$ or forgetting factor $\lambda$ is used throughout one time slot or the plurality of symbols. By such a procedure, the estimator 170 estimates an impulse response $\{Ehj\}$ of the actual transmission channel and feeds it to the matched filter 145 and Viterbi algorithm processor 160A. The estimator 170B includes delay elements 174-0 to 174-L in the form of, for example, successive registers to which the training sequence SYNC or the transmitted symbol sequence estimate $\{Exn\}$ is selectively inputted. A plurality of multipliers 172-0 to 172-L are connected to the inputs and outputs of the delay elements 174-0 to 174-L, as illustrated. The delay elements 174-0 to 174-L each gives a delay equal to the sample interval. The multipliers 172-0 to 172-L each multiplies the input or the output of associated one of the delay elements 174-0 to 174-L by a multiplier $Bh^T{}_n = <h_{0n}, h_{1n}, \ldots, h_{Ln}>$ where B indicates a vector, the multiplier indicates a complex quantity, and the suffix n indicates the nth sample. An adder 175 is connected to the outputs of the multipliers 172-0 to 172-L.

Figure 1B:
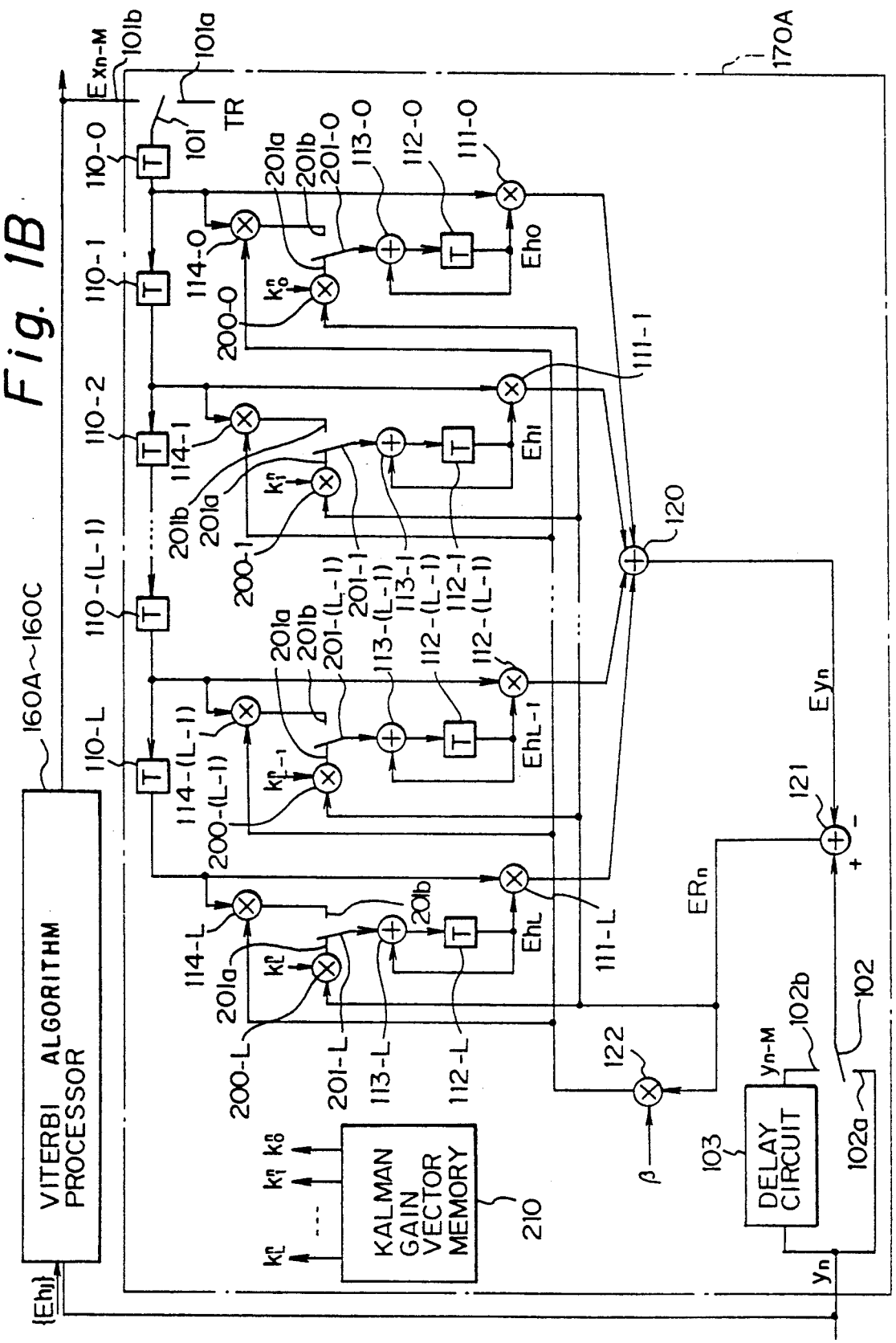
FIG. 1B is a block diagram schematically showing a second and a third embodiment of the present invention.
Figure 8:
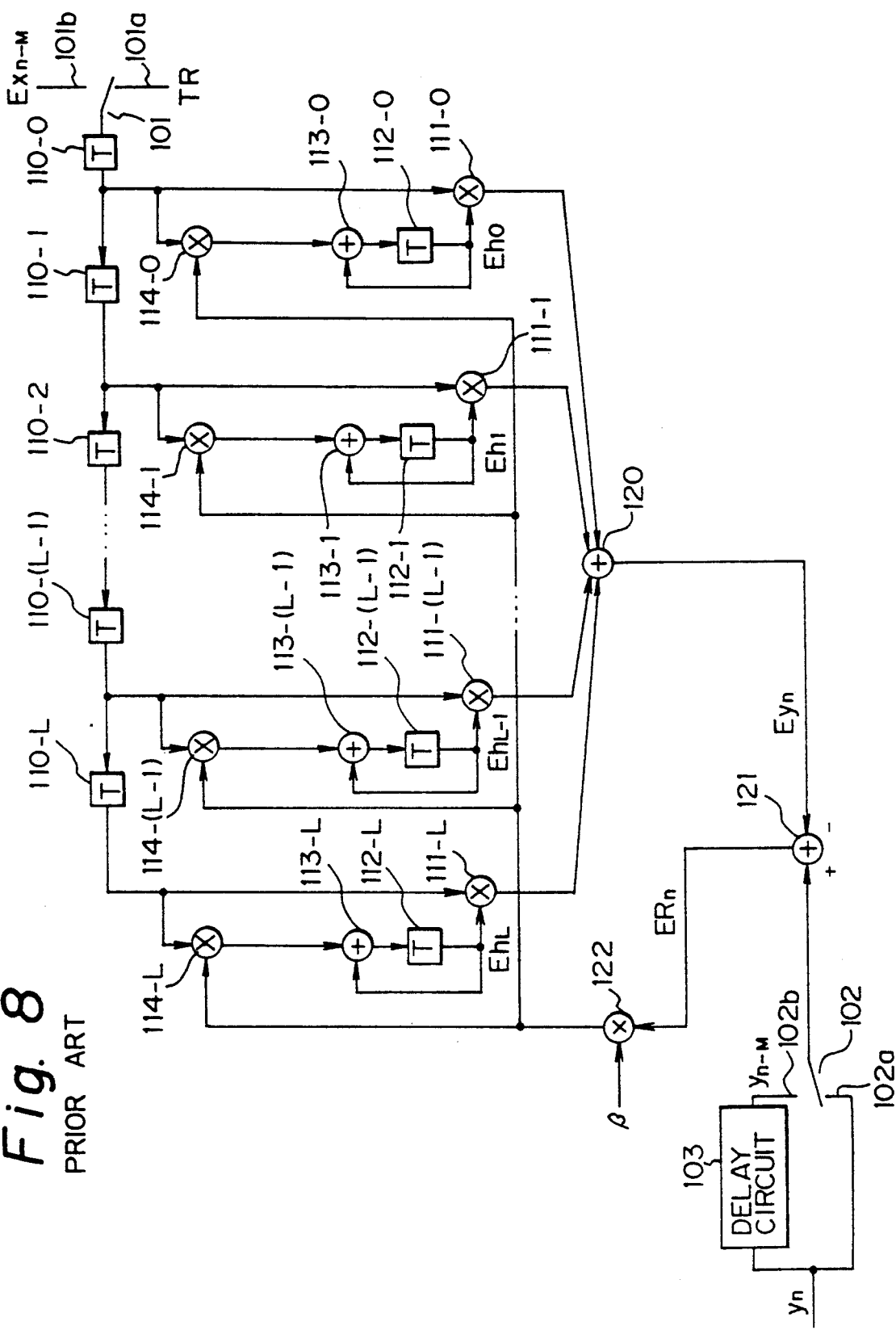
FIG. 8 is a schematic block diagram showing a specific construction of a channel estimator included in the conventional equalizer.

In FIG. 1B which is representative of a second and a third embodiment of the invention, the channel estimator 170A estimates an impulse response $\{Ehj\}$ of the actual transmission channel and delivers it to the Viterbi algorithm processor 160A to 160C. The channel estimator 170A has multipliers 200-0 to 200-L constituting multiplying means, switches 201-0 to 201-L each having contacts 201a and 201b, and a RAM or similar Kalman gain vector memory 210 in addition to the constituents of the conventional channel estimating section shown in FIG. 8. Specifically, the channel estimator 170A has a switch 101 for selecting either of the training sequence TR and the estimated sequence $x_{n-M}$ of transmitted symbols, a switch 102 for selecting either of the received signal $y_n$ and the delayed received signal $y_{n-M}$, and a delay circuit 103 for delaying the received signal $y_n$ and feeding the delayed received signal $y_{n-M}$ to the contact 102b of the switch 102. A plurality of registers (T) 110-0 to 110-L are connected to the switch 101 in a cascade configuration for storing the training sequence TR or the estimate sequence $Ex_{n-M}$ of transmitted symbols. Multipliers 111-0 to 111-L and 114-0 to 114-L are connected at the inputs thereof to the outputs of the registers 110-0 to 110-L, respectively. The outputs of the multipliers 114-0 to 114-L are respectively connected to the inputs of registers 112-0 to 112-L via the contacts 201b of switches 201-0 to 201-L and adders 113-0 to 113-L. The outputs of the registers 112-0 to 112-L are respectively connected to the inputs of the multipliers 111-1 and 111-L and adders 113-0 to 113-L. The outputs of the multipliers 111-0 to 111-L are commonly connected to the input of an adder 120. The multipliers 111-0 to 111-L and adder 120 constitute computing means for computing the estimates $Ey_n$ of received signals $y_n$.

In the embodiment shown in FIG. 1A, the adder 175 adds the outputs of the multipliers 172-0 to 172-L. The output of the adder 175 and that of the memory 130 are connected to an adder 176. The adder 176 subtracts the output of the adder 175 from the sample value $y_n$ of the received signal fed from the memory 130 thereby outputting an error sequence $e_n$. Computing means or computer 178 is connected to the output of the adder 176. Using the RLS or LMS algorithm, the computing means 178 performs computations for reducing the error sequence $e_n$, estimates impulse responses $\{Eh_j\}$ by the identification of multipliers $Bh^T_n = \{h_{0n}, h_{1n}, \ldots, h_{Ln}\}$, and delivers the estimated impulse responses to the Viterbi algorithm processor 160A.

In the second and third embodiments shown in FIG. 1B, the output of the adder 120 and the switch 102 are connected to the input of a subtractor 121. The subtractor 121 plays the role of an estimation error calculator for producing an estimation error $ER_n$ by subtracting the estimate $Ey_n$ of the received signal from the received signal $y_n$ or $y_{n-M}$. The output of the subtractor 121 and a step size $\beta$ are connected to the input of a multiplier 122 whose output is connected to the inputs of the multipliers 114-0 to 114-L. The output of the subtractor 121 is also connected to the inputs of the multipliers 200-1 to 200-L. A particular Kalman gain vector is applied to each of the multipliers 200-0 to 200-L whose outputs are in turn respectively connected to the inputs of the adders 113-0 to 113-L via the contacts 201a of the switches 201-0 to 201-L.

The Kalman gain vector memory 210 stores a vector of Kalman gains calculated from the TDMA training sequence TR beforehand and delivers it to the multipliers 200-0 to 200-L. Specifically, a vector of the Kalman gains $Bk_n$ of RLS algorithm can be calculated by using only the vector of transmitted symbols $Bx_n$ with no regard to received signals $y_n$, as the equations (8) and (9) indicate. Therefore, Kalman gain vectors at successive time instants n in the training period are calculated beforehand by using the equations (8) and (9) and training sequence TR and stored in the memory 210. Here, let the Kalman gain vector at a time n be defined as:

$$Bk_n = \{k_0^n, k_1^n, \ldots, k_L^n\}^T \qquad (18)$$

where $n = 1, 2, \ldots, Nt$ (Nt being the number of training sequences).

Figure 1C:
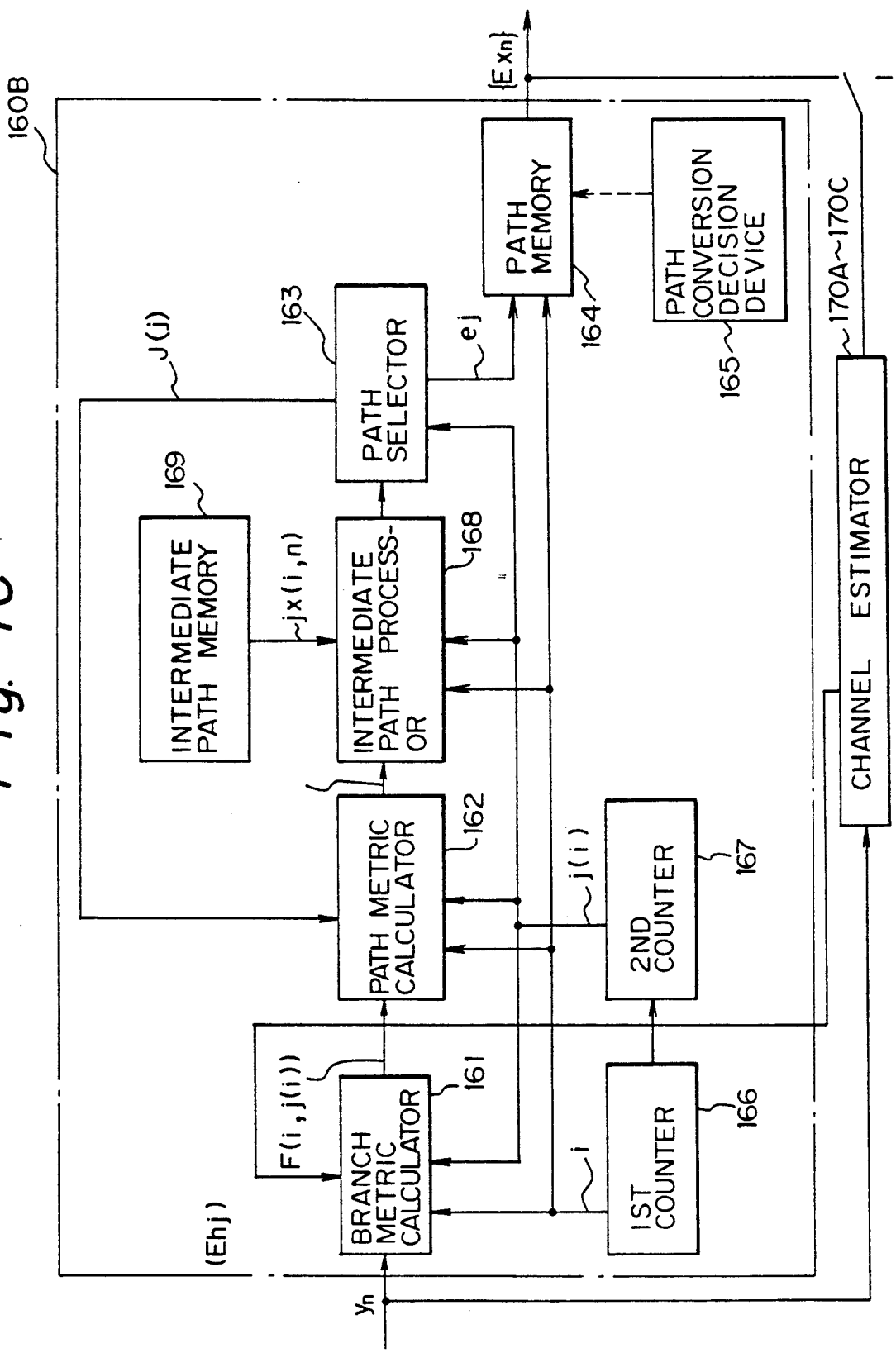
FIGS. 1C, 1D and 1E are schematic block diagrams showing respectively a sixth, a fourth and a seventh embodiment of the present invention.
Figure 1D:
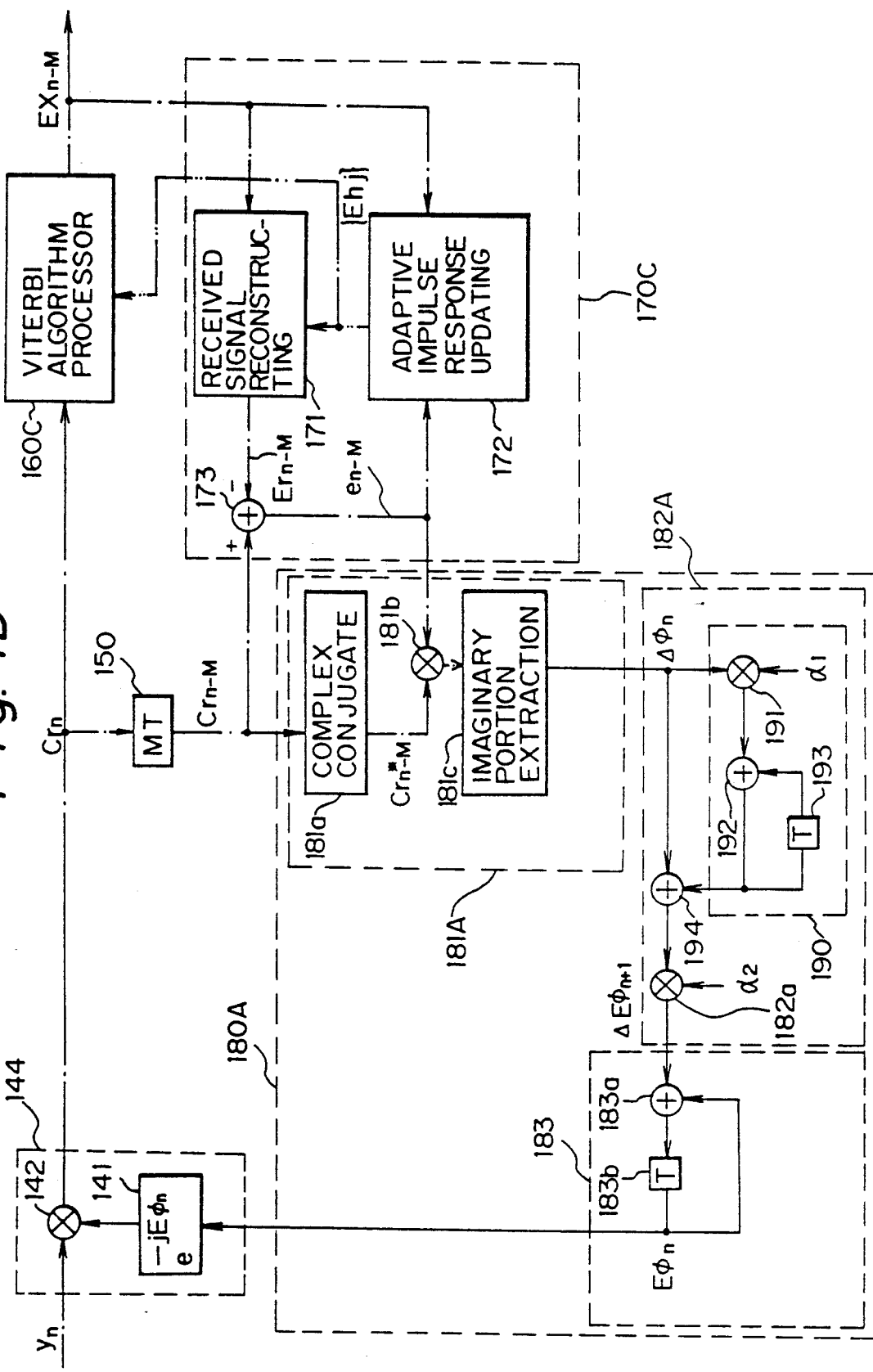
Figure 9:
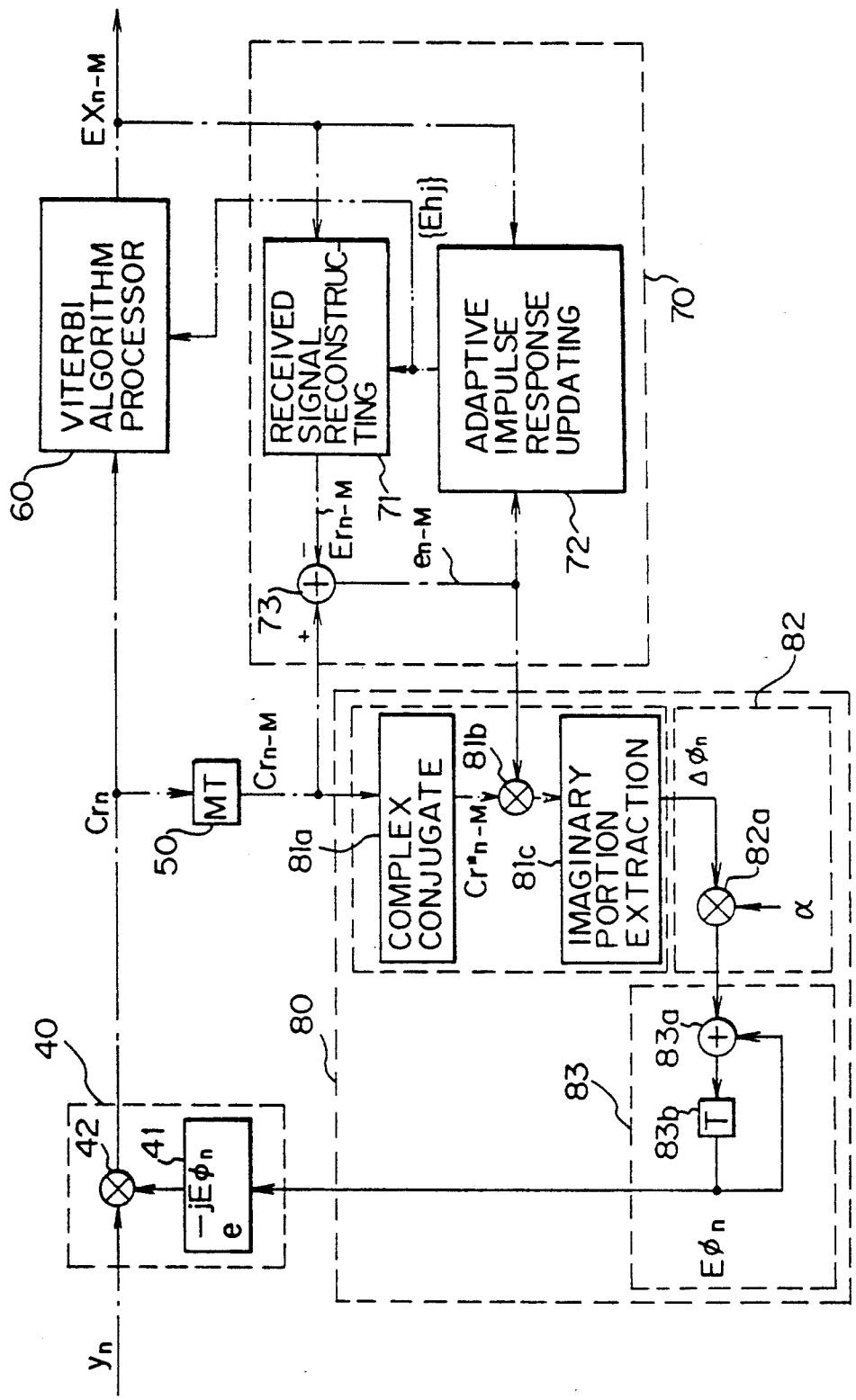
FIG. 9 is a block diagram schematically showing another conventional equalizer.

As shown in FIG. 1D, the fourth embodiment of the invention has a phase estimator 180A different in construction from the conventional phase estimator 80, FIG. 9. Specifically, the phase estimator 180A has a phase error detector 181A, a voltage controlled oscillator 183, and a loop filter 182A. The phase error detector 181A is made up of complex conjugate computing means 181a, multiplying means 181b, and imaginary portion extracting means 181c. The complex conjugate computing means 181a produces the complex conjugate $cr^*_{n-M}$ from the output $cr_{n-M}$ of a delay means 150. The multiplying means 181b multiplies the complex conjugate $cr^*_{n-M}$ and an estimation error $e_{n-M}$ fed from subtracting means 173. The imaginary portion extracting means 181c extracts the imaginary number portion from the output of the multiplying means 181b to produce a phase error $\Delta\phi_n$. The loop filter 182A has integrating means 190 and adding means 194 in addition to the multiplying means 182a. The integrating means 190 integrates phase errors $\Delta\phi_n$ fed thereto from the imaginary portion extracting means 181c. The integrating means 190 is made up of multiplying means 191 for multiplying the phase errors $\Delta\phi_n$ by a multiplier $\alpha 1$, adding means 192, and a register or similar delay means 193 for delaying the output of the adding means 192. The adding means 194 adds the phase error $\Delta\phi_n$ and the output of the integrating means 190 and delivers the sum to the multiplying means 182a. In response, the multiplying means 182a multiplies the output of the adding means 194 by a multiplier $\alpha 2$ to thereby deliver a phase correction amount $\Delta E\phi_{n+1}$ to the voltage controlled oscillator 183. On receiving the correction amount $\Delta E\phi_{n+1}$, the voltage controlled oscillator 183 feeds a phase estimate $E\phi_n$ to the phase rotating section 144. The voltage controlled oscillator 183 is constituted by adding means 183a and a register or similar delay means 183b.

Figure 10:
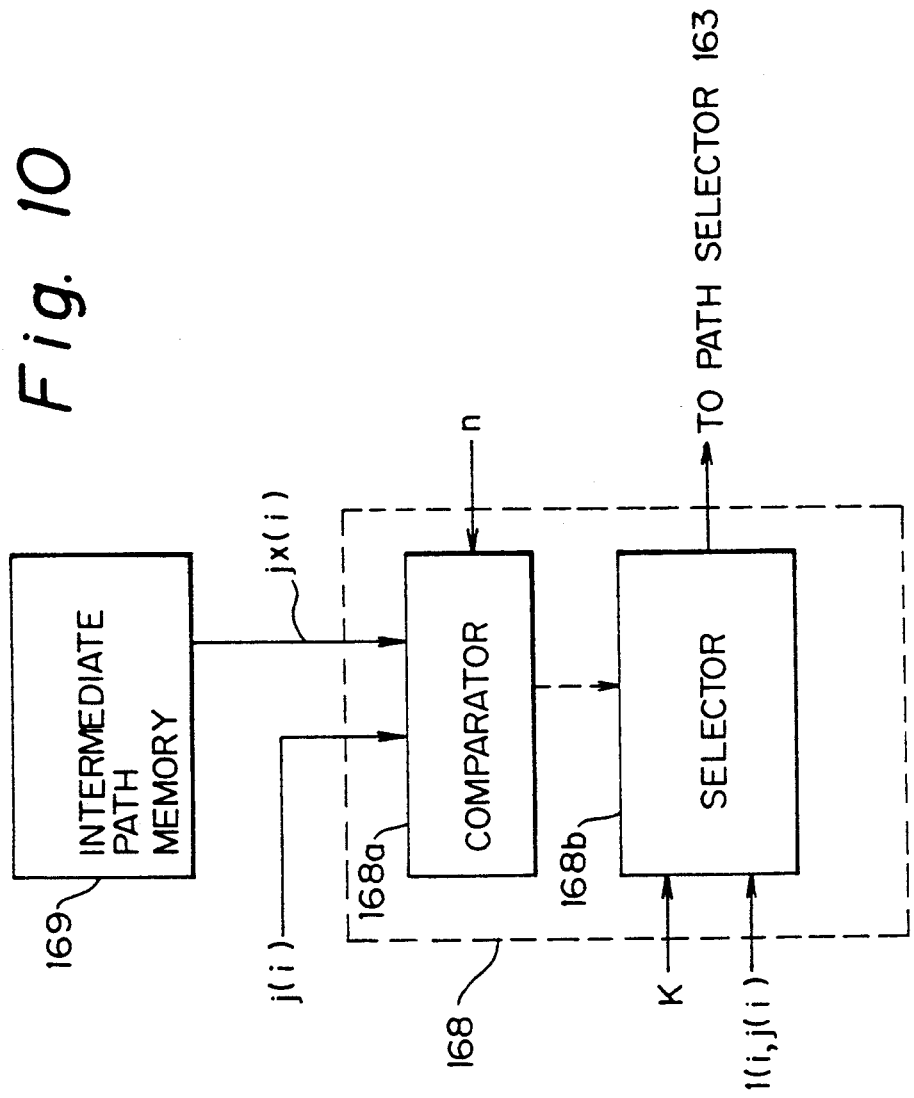
FIG. 10 is a schematic block diagram representative of a fifth embodiment of the present invention.

FIG. 10 shows the intermediate path processor 168 and intermediate path memory 169, FIG. 1C, and is representative of a fifth embodiment of the present invention. As shown, the intermediate path processor 168 has a comparing circuit, or comparator, 168a and a selecting circuit, or selector, 168b for selecting a signal in response to the output of the comparator 168a.

Let one of $M^L$ possible states represented by the equation (5) be designated by a state number i. Here, M denotes the kind of transmitted symbols. Also, let the state at a time immediately preceding the state i be called a branch state and designated by a state number j(i). Regarding QPSK, $4^L$ states exist, and four j(i)'s exist for in each of the states i. Assume that the candidate of an estimated transmitted symbol at a time k is $ex_k$ where e denotes a candidate, and that the path history of the state number j at a time $n-1$ is expressed as:

$$H(n-1j) = \{ex_{n-1}ex_{n-2}, \ldots, ex_1\} \qquad (19)$$

Figure 2A:
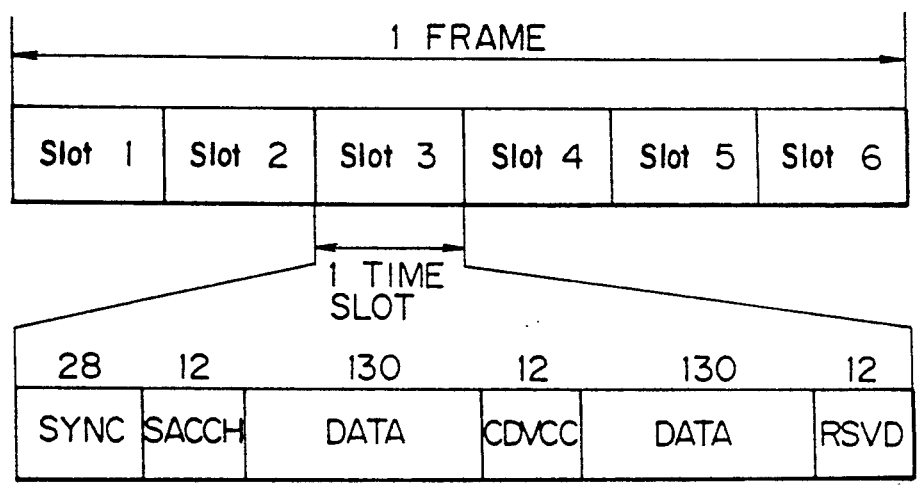
FIGS. 2A and 2B each shows a specific TDMA frame format.

The operation of the equalizer shown in FIG. 1A will be described hereinafter. Assume that the equalizer is incorporated in the receiver 30 shown in FIG. 3. Then, it is necessary for the equalizer to hold one time slot of symbols (complex information), i.e., the sample values $y_n$ of received signals in the memory 60 and complete the equalizing operation before the arrival of the next assigned time slot. For this purpose, the training sequence SYNC, FIG. 2A, represented by the first symbol 28, is used to execute training to thereby determine the initial values of the multipliers $Bh^T_n = (h_{0n}, h_{1n}, \ldots, h_{Ln})$. In the subsequent information period (SACCH and CDVCC) and data period DATA, the Viterbi algorithm processor 160A outputs an estimated transmitted symbol sequence $EX_n$ on the basis of the information of multipliers $Bh^T_n$, i.e., estimates of impulse response $\{Eh_j\}$. At this instant, the delay elements 174-O to 174-L, multipliers 172-O to 172-L, adders 175 and 176 and computing means 178 cooperate to identify the multipliers $Bh^T_n$ of the multipliers 172-O to 172-L. For the identification of the multipliers $h_{0n}, h_{1n}, \ldots, h_{Ln}$, the LMS method is used since the algorithm thereof is comparatively simple. For example, the LMS algorithm for reducing the error sequence $e_n$ to be produced by the adder 176 is as follows:

$$\left.\begin{array}{l} h_{0n} = h_{0n-1} + \beta e_n \cdot Ex^*_n \\ h_{1n} = k_{1n-1} + \beta e_n \cdot Ex^*_{n-1} \\ h_{Ln} = h_{n-1} \beta e_n \cdot Ex^*_{n-L} \end{array}\right\} \quad (20)$$

where the asterisks denotes complex conjugates.

In the above equation (20), $\beta$ is a correction coefficient which depends on the system implemented with the LMS algorithm. In the practical design aspect, how to choose the coefficients $\beta$ is important. If the system to be estimated is little time-varying, the coefficients $\beta$ may be determined by, for example, simulations. Regarding the estimation of a digital cellular transmission path, the optimum correction coefficients are expected to be time-varying due to fading. Therefore, the optimum correction coefficent $\beta$ changes from one time slot to another shown in FIG. 2A or 2B or from one symbol to another.

In FIG. 1, for the identification of the multipliers $Bh^T_n$, the RLS algorithm is used which has inherently high performance in respect of the production of optimum coefficients. For example, the RLS algorithm for reducing the error sequence $e_n$ to be produced by the adder 176 is expressed as:

$$Ey_n = EBx_n \cdot Bh_n^T \quad (21)$$

$$e_n = y_n - Ey_n \quad (22)$$

$$Bk_n = \frac{BP_n \cdot Ex^*_n}{EBx_n^t \cdot BP_n \cdot EBx^*_n + \lambda} \quad (23)$$

$$BP_{n+1} = \frac{1}{\lambda}(BP_n - Bk_n \cdot EBx_n^T \cdot BP_n) \quad (24)$$

$$Bh_{n+1} = Bh_n + Bk_n \cdot e_n \quad (25)$$

and where $EBx^T_n = (Ex_n, Ex_{n1}, \ldots, Ex_{nL})$ where T and the asterisks denote transposition and conjugates, respectively.

The above equations (21)–(25) are represented by the matrix computations of complex numbers since the information or symbols are complex numbers. In the equation (23), $\lambda$ denotes a forgetting factor which depends on the system to which the RLS algorithm is applied. How to choose the forgetting factor $\lambda$ is also important in the actual design aspect. If the system to be estimated is little time-varying, the forgetting factor $\lambda$ may be determined by, for example, simulations. Regarding the estimation of a digital cellular transmission path, the optimum forgetting factor is also expected to be time-varying due to fading. Hence, the optimum forgetting factor differs from one time slot to another shown in FIGS. 2A or 2B or from one symbol to another.

The operation of the fourth embodiment shown in FIG. 1D is as follows. Let the sample value $y_n$ of a received signal be defined as:

$$y_n = r_n \exp[j\phi_n] \quad (26)$$

where $\phi_n$ is a variation of phase due to frequency offset and phase jitter, and $r_n$ is a sample value of a received signal obtainable in the absence of such a phase variation. By using the vector $Bh_n$ of impulse responses and the vector $BX_n$ of transmitted symbols, the sample value $r_n$ may be produced by:

$$r_n = Bh_n \cdot Bx_n \quad (27)$$

where
$Bh_n = \{h_o^n, h_1^n, \ldots, h_L^n\}$ and
$Bx_n = \{x_n, x_{n-1}, \ldots, x_{n-L}\}$
where T denotes the transposition of vector.

Assume that the receiver 30 shown in FIG. 3 is employed. As the value $y_n$ of the received signal sampled at the symbol interval T is applied to the phase rotating section 144, the section 144 causes the computing means 141 to determine a phase rotation $\exp[-jE\phi_n]$ on the basis of the phase estimate $E\phi_n$ estimated by the phase estimator 180A and then causes the multiplying means 142 to multiply the sample value $y_n$ by the computed phase rotation, thereby producing a phase-corrected sample value $cr_n$:

$$cr_n = r_n \exp[j(\phi_n - E\phi_n)] \quad (28)$$

The resulting sample value $cr_n$ is fed to the delay means 150 and Viterbi algorithm processor 160c. The delayed sample value $cr_{n-M}$ from the delay means 150 is applied to the complex conjugate computing means 181a of the phase error detecting circuit 181A and the subtracting means 173 of the channel estimator 170c.

The channel estimators 170A–170C each estimates the impulse response of the transmission channel by using the training sequence and the corresponding sample values $y_n$ of the received signal. This may be done with the LMS algorithm or a similar adaptive algorithm. The channel estimators 170A–170C continue the estimation of the impulse response by use of sample values $y_n$'s and estimates $Ex_n$'s of the transmitted symbols. The estimated impulse responses {Ehj} are fed to the branch metric calculator 161 included in the Viterbi algorithm processor 160B.

In the second and third embodiments shown in FIG. 1B, during the training period, the switches 101 and 102 select their contacts 101a and 102a while the switches 201-0 to 201-L select their contacts 201a. In this configuration, the multipliers 111-0 to 111-L and adder 130 generate an estimate $Ey_n$ of a received signal represented by the equation (3) out of the training symbol $x_n$ at a time n, training sequence $\{x_{n-1}, \ldots, x_{n-L}\}$ stored in the registers 110-0 to 110-L, and the impulse response estimate $Eh_j^{n-1}$ (j=0, 1, . . . , L) of the transmission channel at a time n−1 stored in the registers 112-0 to 112-L. The resulting estimate $Ey_n$ is subtracted from the received signal $y_n$ to produce an estimation error $ER_n$. Subsequently, the multipliers 200-1 to 200-L and adders 113-0 to 113-L update the impulse response estimate at the time n−1 on the basis of the estimation error $ER_n$ and the Kalman gain vector $Bk_j$ at the time n stored in the Kalman gain vector memory 210 and according to the equation (13). The updated estimate is written to the registers 112-0 to 112-L as an estimate $Eh_j^n$ (j=0, 1, . . . , L) at the time n. After the training, the impulse response of the transmission channel is estimated even in the data portion (data sequence DA) in order to follow changes of the transmission channel due to fading. For this purpose, the switches 101, 102 and 201-0 to 201-L select the contacts 101b, 102b and 201b, respectively. In this condition, a procedure similar to the training procedure is executed by using the estimates $Ex_{n-M}$ of transmitted symbols obtained from the path portion up to the time n−M converged at the time n in the Viterbi algorithm processors 160A–160C and the received signals $y_{n-M}$ delayed M symbol intervals by the delay circuit 103, whereby the impulse response of the transmission channel is estimated.

In the fourth embodiment shown in FIG. 1D, the Viterbi algorithm processor 160C receives sample values $cr_n$ of received signals and, in turn, estimates a transmitted symbol sequence on the basis of the impulse response estimate $Eh_j$ of the transmission channel 20 produced by adaptive impulse response updating means or section 172, outputting the resulting symbol sequence estimate $\{Ex_n, Ex_{n-1}, \ldots, Ex_{n-L}\}$.

In the sixth embodiment shown in FIG. 1C, the Viterbi algorithm processor 160C causes the first counter 166 to sequentially generate the state numbers i from "1" to "$M^L$" in response to the sample values $y_n$ of the received signals. Every time a single state number i is generated, the second counter 167 sequentially generates branch state numbers j(i). The branch metric calculator 161 calculates a branch metric F (i, j(i)) by using a partial sequence $\{ex_n, ex_{n-1}, \ldots, eX_{n-L}\}$ of symbols which may have been transmitted and is determined by the state i and branch state j(i), the sample values $y_n$ of the received signal, and the impulse response estmate $\{Eh_j\}$ of the transmission channel, as follows:

$$F(i, j(i)) = \left| y_n - \sum_{j=0}^{L} ex_{n-j} \cdot Eh_j \right|^2 \quad (29)$$

The path metric calculator 162 computes the path metric I (i, j(i)) of the paths at the state i and branch state j(i) by using the branch metrics F (i, j(i)) and the path metrics J (j(i)) at the time n−1 in the state j(i), as shown below:

$$I(i, j(i)) = J(j(i)) - F(i, j(i)) \quad (30)$$

The operation of the intermediate path processor 168 will be described specifically later. The path selector 163 selects, among all the branch states j(i) belonging to a single state i, one having the largest path metric I(i, j(i)). Assuming that the state number j(i) of the branch state selected is the state number ej of a surviving path, the largest value of path metric I(i, ej) is held in the path metric calculator 162 as J(i) for implementing the calculation of path metrics at the subsequent time n+1. The path memory 164 updates and holds the path history of the state number i by using the state number ej of the surviving path, as follows:

$$H(n, i) = \{ex_n, H(n-1, ej)\} \quad (31)$$

The above procedure is repeated for all the state numbers i, i.e., from "1" to "$M^L$". Subsequently, the path conversion decision device 165 determines whether or not the path is coincident throughout the state numbers i by referencing the contents of the path memory 164. Then, the decision device 165 outputs the coincident part of the contents of the path memory 164 as a transmitted symbol sequence estimate $\{Ex_k\}$. Further, the same procedure is repeated for all the sample values $y_n$ of or received signals to produce all the estimates $\{Ex_n\}$ of the transmitted symbol sequence.

A reference will be made to FIG. 10 for describing the operations of the intermediate path processor 168 and intermediate path memory 169 which are the characteristic features of the fifth embodiment. When known data exists in the intermediate portion of a TDMA frame format, this embodiment uses such data to estimate an impulse response. For example, in the North American standards frame configuration shown in FIG. 2A, a sequence CDVCC for adjacent channel identification exists in the intermediate portion of the TDMA frame format. The sequence CDVCC is set at the beginning of a conversation and is used to see if data received during the conversation is meant for the channel over which the conversation is being conducted or if it is meant for another channel using the same frequency. Hence, the impulse response of a transmission channel can be correctly estimated if the symbol sequence of such known data is used as a training sequence. However, in the case of differential coding, it is only a variation of the phase of the symbols that can be determined with the known data, i.e., it is impossible to determine the definite symbol sequence of the known data. In the light of this, the intermediate path processor 168 and intermediate path memory 169 determine a symbol sequence in the known data period by the following procedure.

According to the Viterbi algorithm, once a state number i at a time n is determined, a single symbol which may have been transmitted at the time n is determined. By using the absolute phase of such a single symbol and a the phase variation of a symbol sequence of known data, it is possible to calculate the absolute phase of the symbol sequence at the immediately preceding time instant which leads to the state i and, therefore, to the number of a branch state leading to the state i. Before Viterbi algorithm processing, the number jx (i, n) of the branch state leading to the state i at the time n in the known data period is computed for all of the state numbers i and held in the intermediate path memory 169. In the intermediate path processor 168, a comparator 168a compares the branch states j(i) in the state i at the time n with jx (i, n) in the known data period. If the former does not coincide with the latter, a selector 168b substitutes an extremely small value K for the path metric I (i, j(i)) produced by the path metric calculator 162 and delivers it to the path selector 163. It follows that the previously stated iterative Viterbi algorithm processing allows the path selector 163 to select a path having the largest path metric I(i, j(i)). Therefore, the path in the known data period automatically converges to a correct path associated with the phase variation of the known data, whereby the correct symbol sequence in the known data period is determined.

In the fourth embodiment shown in FIG. 1D, received signal reconstructing means or section 171 is included in the channel estimator 170C and determines estimates $Er_{n-M}$ of received signals on the basis of the transmitted symbol sequence estimate $\{Ex_n, Ex_{n-1}, \ldots, Ex_{n-L}\}$ and the impulse response estimate $Eh_j$ of the transmission channel 20. The estimate $Er_{n-M}$ is fed from the received signal reconstructing means 171 to subtracting means 173. The subtracting means 173 subtracts the estimate $Er_{n-M}$ from the sampled value $cr_{n-M}$ of the received signal from the delay means 150 to produce an estimation error $e_{n-M}$. The estimation error $e_{n-M}$ is applied to the multiplying means 181b of the phase error detecting circuit 181A and the adaptive impulse response updating means or section 172. The phase error detecting circuit 181A causes the complex conjugate computing means 181a to compute complex conjugate $cr^*_{n-M}$ from the sample values $cr_{n-M}$ of the received signals delayed by the delay means 150. The multiplying means 181b multiplies the complex conjugate $cr^*_{n-M}$ and the estimation error $e_{n-M}$ of the transmission channel. The imaginary portion extracting means 181c separates the imaginary number portion from the product fed from the multiplying means 181b to thereby produce a phase error $\Delta\phi_n$:

$$\Delta\phi_n = \phi_n - E\phi_n \tag{32}$$

The phase error $\Delta\phi_n$ is applied to the loop filter 182A. In the loop filter 182A, integrating means 190 causes multiplying means 191 thereof to multiply the phase error $\Delta\phi_n$ by the multiplier $\alpha1$ and then causes adding means 192 to add the resulting product to the output of delay means 193. The delay means 193 delays the output of the adding means 192 and feeds back the delayed output thereof to the adding means 192. As a result, the integrating means 190 integrates the phase errors $\Delta\phi_n$ to produce the mean value thereof. The mean phase error and the phase error $\Delta\phi_n$ are added by adding means 194. The multiplying means 182a multiplies the output of the adding means 194 by a multiplier $\alpha2$ to produce a phase correction amount $\Delta E\phi_{n+1}$ and delivers it to the voltage controlled oscillator 183. The voltage controlled oscillator 183 adds the phase correction amount $\Delta E\phi_{n+1}$ to the phase estmate $E\phi_n$ by the adding means 183a, delays the resulting sum by the delay means 183b, and then delivers the delayed sum to the phase rotating section 144 as a new phase estimate $E\phi_{n+1}$.

Figure 1E:
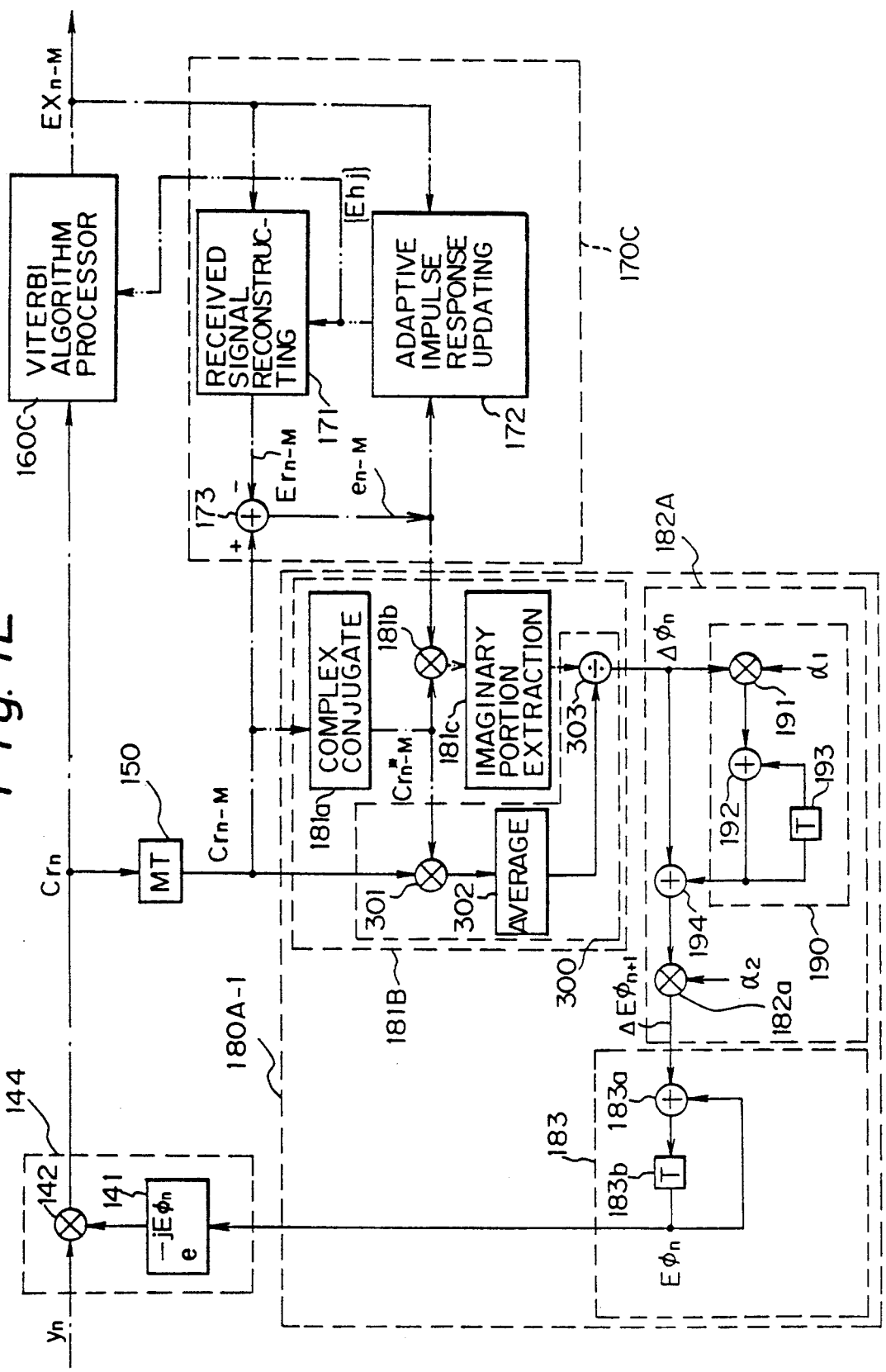

Referring to FIG. 1E, a seventh embodiment of the present invention will be described. In FIG. 1E, the same or similar constituents to those shown in FIG. 1D are designated by like reference numerals, and redundant description will be avoided for simplicity. As shown, the optimum sequence estimator has a phase estimator 180A-1 in place of the phase estimator 180A of FIG. 1D. The phase estimator 180A-1 has a phase error detecting circuit 181B different in construction from the phase error detecting circuit 181A of FIG. 1D, and the same loop filter 182a and voltage controlled oscillator 183 as those of FIG. 1D. The phase error detecting circuit 181A-1 has standardizing means 300 for producing a short-term mean of received signals, in addition to the complex conjugate computing means 181a, multiplying means 181b and imaginary portion extracting means 181c of the phase error detecting means 181A, FIG. 1D. The standardizing means 300 is made up of multiplying means 301 for multiplying the complex conjugate $cr^*_{n-M}$ by the output $cr_{n-M}$ of the delay means 150, averaging means 302 for averaging the results of multiplication, and dividing means 303 for dividing the output of the imaginary portion extracting means 181 by the output of the averaging means 302. From the equation (15), the output of the phase error detecting means, FIG. 1E, 181B is expressed as:

$$Im[e_n \cdot cr_n^*] = Im[(cr_n - Er_n)cr_n^*] \tag{33}$$
$$= Im[Er_n^* \cdot cr_n]$$

Assuming that the channel estimator 170C and phase estimator 180A-1 are operating adequately, then the equation (33) may be rewritten as:

$$Im[E_n \cdot cr_n^*] = A \cdot H^2 \cdot \sin(\Delta\phi_n) \tag{34}$$
$$\approx A \cdot H^2 \cdot \Delta\phi_n$$

where A denotes the square mean of the vectors of transmitted symbols which is dependent on the modulation system, and H denotes the absolute value of the impulse response vector of the transmission channel 20. Regarding a transmission channel with frequency-selective fading in a land mobile communication system, the absolute value H varies with time. Therefore, assuming that the multiplier $\alpha$ of the equation (17) is fixed, the phase error extraction using the equation (34) would include, as a correction amount of the estimated phase, the fluctuation of a channel with frequency-selective fading which is not related to the phase error. On the other hand, from the equations (28) and (27), the power of phase-corrected received signal is given as:

$$|cr_n|^2 = cr_n \cdot cr_n^* = r_n \cdot r_n^* = A \cdot H^2 \tag{35}$$

Hence, by dividing the equation (10) by the equation (35), it is possible to extract only the phase error $\Delta\phi_n$. However, in the case of frequency-selective fading, the level of a received signal sometimes becomes extremely low for a moment and makes division by the equation (35) impossible. By contrast, with the short-term mean power $A[cr_n \cdot cr_n^*]$ (where $A[\cdot]$ indicates a mean) produced by the standardizing means 300 and covering several samples, it is possible to extract only the phase error by using the equation:

$$\frac{Im[e_n \cdot cr_n^*]}{A[cr_n \cdot cr_n^*]} = \Delta\phi_n \tag{36}$$

Figure 11:
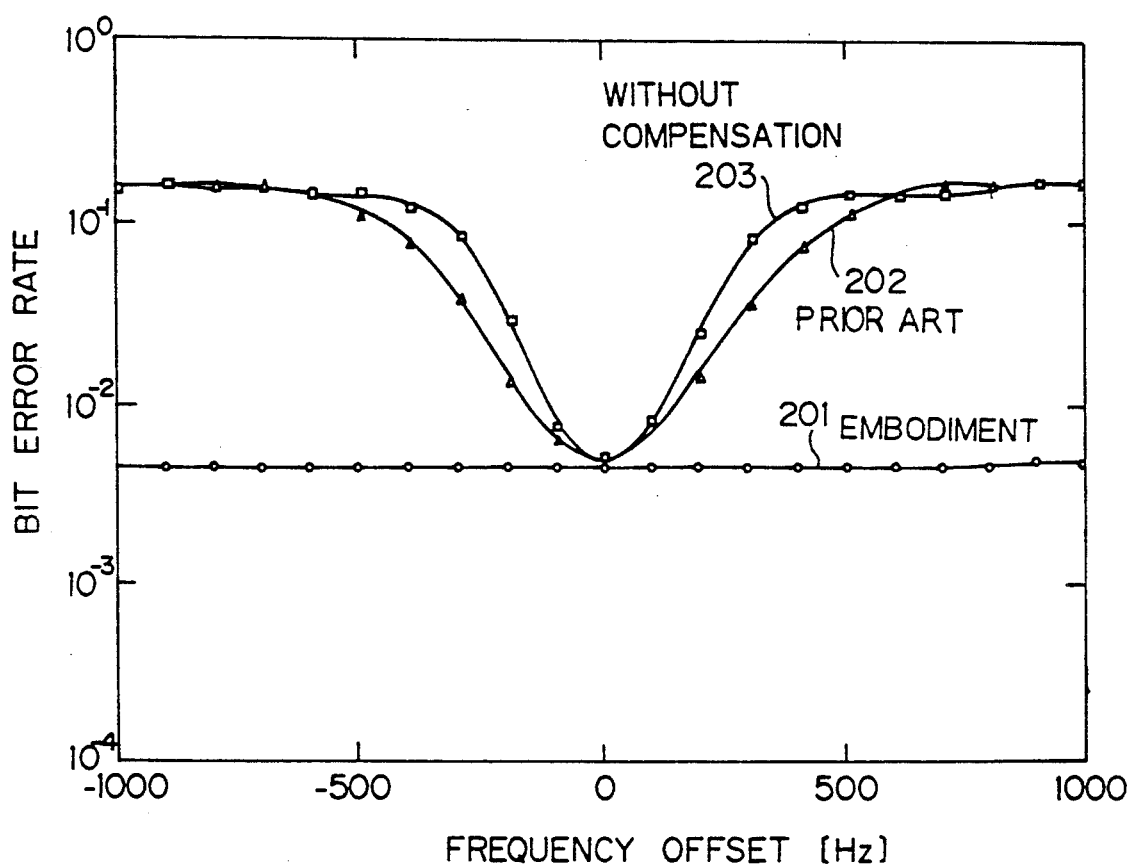
FIG. 11 is a graph comparing a conventional equalizer and the embodiment of FIG. 1E with respect to a relation between frequency offset and bit error probability determined by simulations.

The first embodiment of the present invention has various unprecedented advantages, as follows. For the phase estimator 180A and phase rotating section 144 to correct a phase variation, the mean component of phase errors calculated by the integrating means 190 is added to the instantaneous phase error $\Delta\phi_n$ to thereby add a predetermined increment to the phase estimate. This compensates for the regular phase rotation ascribable to frequency offset, as with a second order phase locked loop. In this manner, phase variations due to frequency offset and phase jitter are corrected by the second order phase locked loop, whereby regular phase rotations ascribable to frequency offset can be corrected. It follows that transmitted symbols can be estimated against a broad range of frequency offset with a minimum of error rate. To illustate such an advantage, FIG. 11 shows the results of simulations as to the frequency offset and the bit error rate in the case of a frequency-selective fading transmission channel of a two-wave model. In FIG. 11, waveforms 201, 202 and 203 indicate respectively a characteristic achievable with the embodiment, a conventional characteristic, and a characteristic without phase variation correction. For the simulations, the symbol interval T was selected to be 41 $\mu$sec, the maximum Doppler frequency was selected to be 80 Hz, the wave was delayed by 1.0 T, and Eb/NO (ratio of signal power to noise power per bit) was selected to be 20 dB. As FIG. 11 indicates, while the frequency offset range implementing bit error rates less than $10^{-2}$ and available with a conventional optimum sequence estimator is about $\pm 150$ Hz, the embodiment fully prevents the error rate from aggravating over the frequency offset range of $\pm 1$ kHz, as in the case wherein the frequency offset is zero.

The sixth embodiment shown in FIG. 1C has the following advantage. A path which a transmission channel should take in an intermediate known data period of a TDMA frame format is calculated on the basis of the known data beforehand and stored in the intermediate path memory 169. When the path metric of the state of the known data period is to be calculated, the path metrics of, among the paths which may occur from the state at the immediately preceding time instant, the paths not coincident with the path stored in the intermediate path memory 169 are made extremely small. This allows the path of the known data period to automatically converge to a correct path. Therefore, accurate estimates $\{Ex_n\}$ of transmitted symbols are achievable in the known data period to prevent the estimate of impulse response from deviating from a correct value, thereby improving the bit error rate.

In FIGS. 1A and 1C, the computing means 178 estimates a transmission channel by use of a plurality of adequately selected correction coefficients $\beta$ on a time slot basis or on a multiple symbol basis and on the basis of the equation (21). The estimates $\{Eh_j\}$ of impulse responses of the estimated transmission channel are applied to the matching filter 145 and Viterbi algorithm processor 160A. The Viterbi algorithm processor 160A computes a path metric by using the equation (17) while the calculator 161 estimates a transmitted symbol sequence which maximizes the path metric. The maximum value of the path metrics which estimates the transmitted symbol sequence is totalized over a single time slot or over a plurality of symbols. An estimated transmitted symbol sequence $\{Ex_n\}$ which maximizes the totalized value is selected as the output of the equalizer. It is to be noted that since the information (symbols) is a complex number, the equation (21) is indicative of a complex number while the path estimator 170B is constructed to process the real number portion and imaginary number portion of the complex number.

Figure 12:
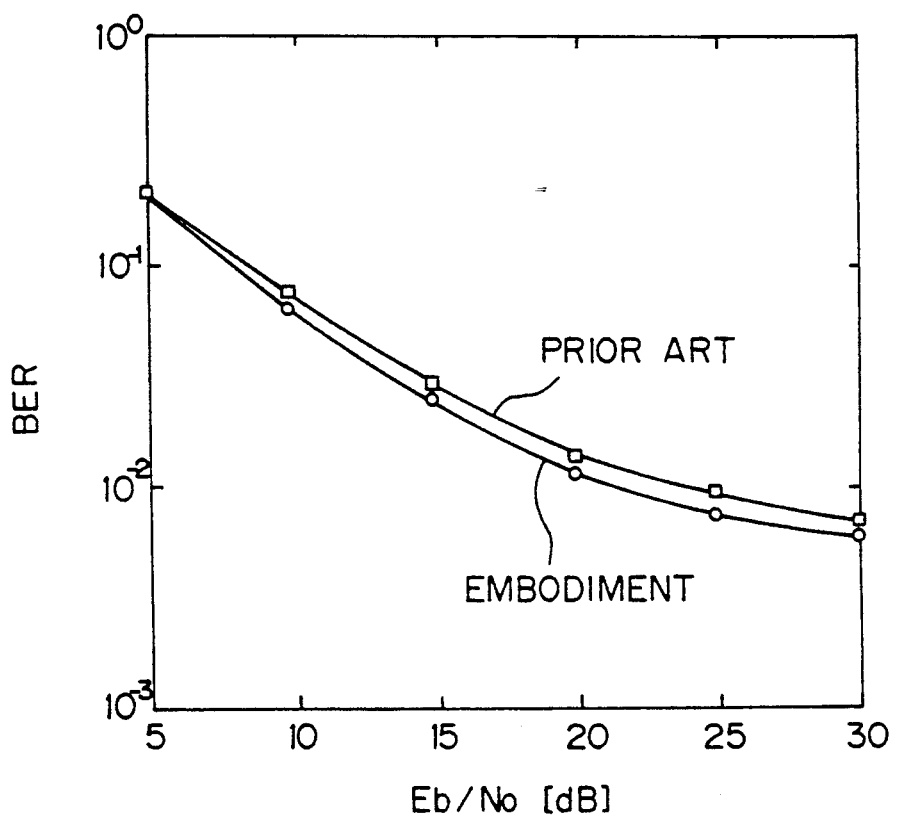
FIG. 12 is a graph showing the bit error probability achievable with the embodiment of FIG. 1C and also determined by simulations.

To illustrate an advantage achievable with the sixth embodiment, FIG. 12 shows the results of simulations as to the bit error rate and particular to a frequency-selective fading transmission channel of a two-wave model. In FIG. 12, the abscissa and the ordinate indicate respectively the ratio of signal power to noise power per bit Eb/NO (dB) and the bit error rate BER. The simulations were conducted with a symbol interval T of 41 $\mu$sec, a fading frequency of 60 Hz, and a delay of a wave of 1.0 T. As FIG. 12 indicates, with the embodiment, it is possible to achieve BER of $10^{-2}$ at Eb/NO which is about 2.5 dB smaller than the conventional optimum sequence estimator.

Figure 13:
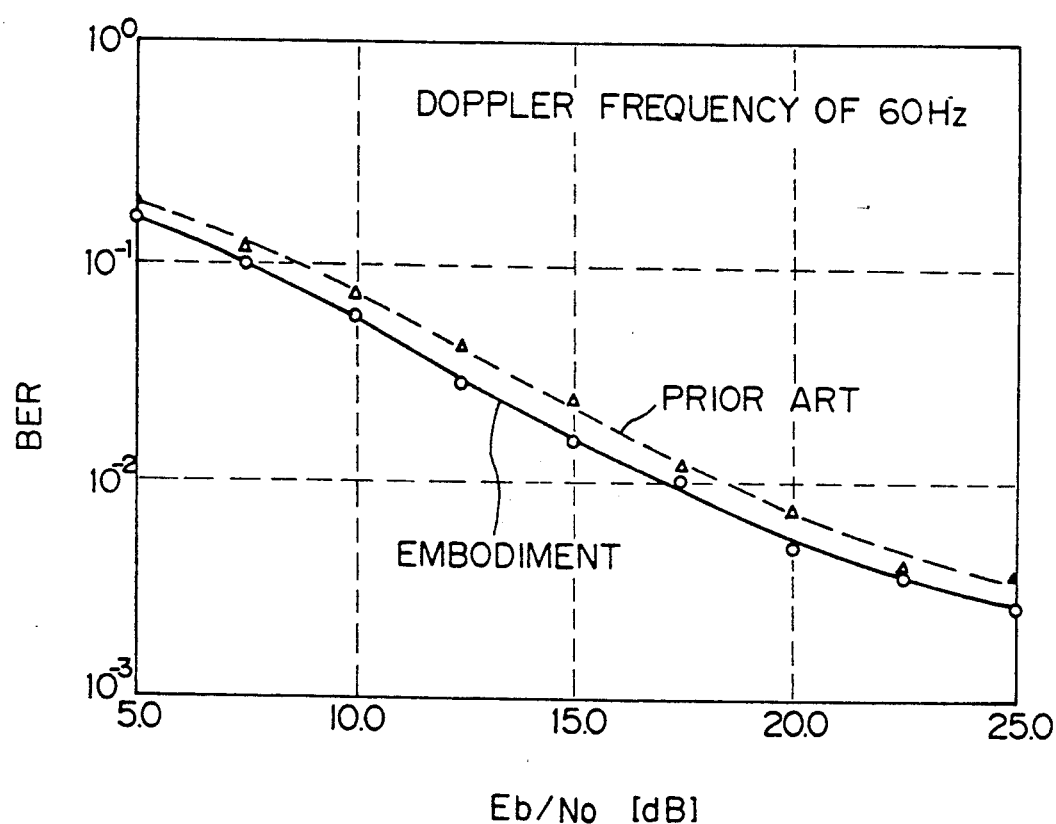
FIG. 13 is a graph indicative of the bit error characteristic of a delay 1T (40 $\mu$sec) of FIG. 1A.

FIG. 13 shows the results of simulations regarding the bit error rate and obtained with the first embodiment applied to a single time slot, i.e., the bit error characteristic derived from the delay of 1 T (40 $\mu$sec) of FIG. 1A. For the simulations, use was made of the North American standards digital cellular system shown in FIGS. 2A and 2B together with a two-wave model. In the figure, the abscissa and the ordinate indicate respectively the ratio of signal power to noise power Eb/NO (dB) per bit and the bit error rate BER. The simulations were effected with a symbol interval T of 40 $\mu$sec, a fading frequency of 60 Hz, and a delay of 1.0 T. From FIG. 13, it will be seen that the first embodiment reduces the bit error rate BER, compared to a conventional equalizer. Specifically, the embodiment successfully reduces the error of the estimate of impulse response $\{Eh_j\}$ by the channel estimator 170B and thereby reduces the transmitted symbol estimation error, i.e., bit error rate BER (symbol error rate) output-ted by the Viterbi algorithm processor 160A. It follows that the embodiment remarkably enhances the performance of, for example, the receiver shown in FIG. 3.

In the second and third embodiments shown in FIG. 1B, the channel estimator 170A estimates an impulse response of the transmission channel by using the RLS algorithm during the training period or using the LMS algorithm during the data period, delivering the estimate to the Viterbi algorithm processors 160A–160C. Further, the embodiments compute the Kalman gain vector of the RLS algorithm by using the training sequence TR beforehand and stores it in the memory 210. Hence, the channel estimator 170A is capable of performing the an adaptive estimation of the impulse response by the same amount of calculations as with a conventional estimator. Moreover, since the estimation in the training period rapidly converges, the optimum sequence estimation by the Viterbi algorithm processors 160A–160C is free from critical error rates.

In summary, it will be seen that the present invention provides an equalizer which reduces symbol error probability by reducing the error of the impulse response estimate of a transmission channel and, therefore, transmitted symbol estimation error. Hence, the equalizer is capable of remarkably enhancing the performance of, for example, a receiver incorporated in a mobile radio communication system, e.g., a digital cellular communication system. This advantage is derived from a unique arrangement wherein a channel estimator estimates an optimum sequence by using a plurality of correction coefficients or forgetting factors of RLS or LMS algorithm in a data period or a control information period over one time slot or a plurality of symbols. A Viterbi algorithm processor selects an optimum RLS or LMS forgetting factor which maximizes the maximum path metric. The channel estimator performs estimation by use of such an optimum RLS or LMS forgetting factor.

In one of the embodiments shown in FIG. 1B, in an optimum sequence estimator having a Viterbi algorithm processor and a channel estimator for estimating the impulse response of a channel by an adaptive algorithm, the channel estimator estimates the impulse response of a transmission channel by using the RLS algorithm during the training period or using the LMS algorithm during the data period. Hence, the estimator can complete adaptive estimation of the impulse response with the same amount of computation as a conventional estimator and causes the estimation to rapidly converge in the training period, whereby the error probability of optimum sequence estimation is reduced.

In the other embodiment of FIG. 1B, the equalizer has a Kalman gain vector memory and a multiplier in a channel estimator thereof. A Kalman gain vector of the RLS algorithm is computed by use of a training sequence beforehand and stored in the Kalman gain vector memory. The multiplier multiplies the stored value and an estimation error. The impulse response estimate of the channel is updated on the basis of the resulting product. The equalizer, therefore, completes an adaptive estimation of the impulse response of the channel rapidly and accurately with a minimum amount of calculation, enhancing the estimation accuracy of the Viterbi algorithm processor.

In the embodiment shown in FIG. 1D, the equalizer has integrating means and adding means for compensating for phase fluctuations due to frequency offset and phase jitter. Such an equalizer compensates for regular phase rotations due to frequency offset and, therefore, estimates transmitted symbols accurately with a minimum of error probability over a broad range of frequency offset.

In the embodiment shown in FIG. 1E, the equalizer has standardizing means for standardizing a phase error extracted by a PLL by the short-term average power of received signals. Hence, even on a transmission channel with frequency-selective fading, the equalizer is capable of estimating transmitted symbols with accuracy.

In the third embodiment shown in FIG. 1C, in an optimum sequence estimator using Viterbi algorithm for estimating a differential coded transmitted symbol sequence, a path which a transmission channel should take in a known data sequence included in a transmitted data sequence is calculated on the basis of the known data sequence and stored in an intermediate path memory. When the path metric of the state of the known data sequence is to be calculated, the path metrics of, among the paths which may occur from the state at the immediately preceding time instant, the paths not coincident with the path stored in the intermediate path processor are made extremely small and applied to a path selector. The equalizer, therefore, allows the path of a known data sequence to automatically converge to a correct path, so that correct estimates of transmitted symbols are obtainable in the known data sequence. This prevents the impulse response estimate of the transmission channel from deviating from the correct impulse response and thereby promotes accurate estimation of transmitted symbols.

Further, in the seventh embodiment shown in FIG. 10, an intermediate path processor is made up of a comparator and a selector. The comparator determines whether or not each of the intermediate paths which may occur from the immediately preceding time instant is coincident with a path stored in the intermediate path memory. If the output of the comparator is negative, the selector makes the path metric extremely small. As a result, the path of a known data sequence converges to correct one, allowing a correct transmitted symbol sequence estimate to be determined with ease.

While the present invention has been described with reference to the particular illustrative embodiments, it is not to be restricted by those embodiments but only by the appended claims. It is to be appreciated that those skilled in the art can change or modify the embodiments without departing from the scope of the present invention. For example, in the configuration of FIG. 1B, a matched filter or a whitening matched filter may be connected to the received signal input of the Viterbi algorithm processors 160A-160C so as to apply the output thereof to the latter. In such a case, the path metric calculator of the processors 160A-160C will use equations different from the equations of the embodiment. While the switches 101 and 102 and delay circuit 103, FIG. 1B, are incorporated in the channel estimator 170A, they may be arranged outside the channel estimator 170A, if desired.

Although the embodiments have been shown and described in relation to an adaptive optimum sequence estimator constituting an equalizer for digital mobile communication, they are, of course, applicable to data communication in a fixed communication network.

Figure 2B:
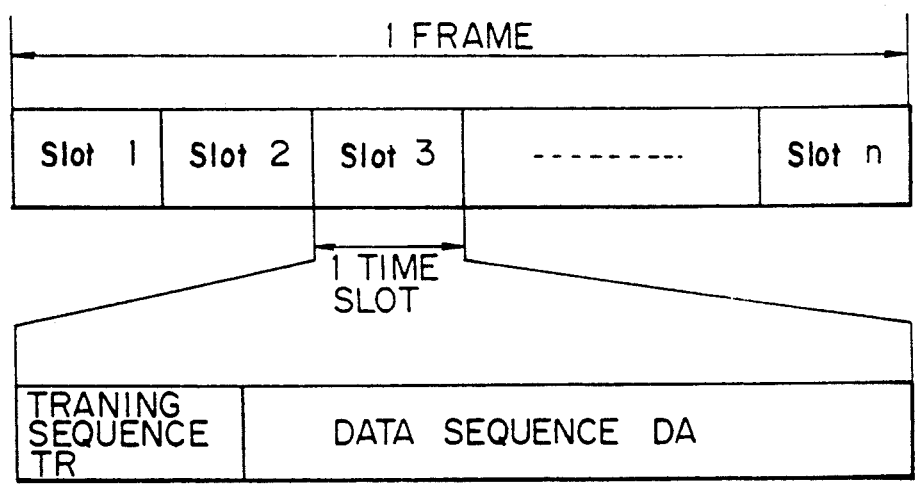

The matched filter 145 shown in FIG. 1A may be replaced with a whitening filter or any other suitable filter or may even be omitted to feed the output of the memory 130 directly to the Viterbi algorithm processor 160A. This is practicable only if the equations for computing path metrics are changed. In the first embodiment, the TDMA frame formats according to the North American standards as shown in FIGS. 2A and 2B may be replaced with any other data sequence.

In the embodiments shown in FIGS. 1D and 1E, the multipliers $\alpha 1$ and $\alpha 2$ assigned to the loop filter 182A may be multiplied at positions other than the positions shown in the figures so long as the effects remain the same. For example, the multiplying means 182a may be connected to the output of the imaginary portion extracting means 181c to multiply an extracted portion by the multiplier $\alpha 2$. If desired, a matched filter or a whitening matched filter may be connected to the input of the Viterbi algorithm processor 160c for reducing the S/N ratio, in which case the processor 160c will perform different computations.

While the embodiment of FIG. 1C uses a quantity proportional to the logarithmic likelihood, equation (16), for calculating path metrics, it may alternatively use the absolute value of the equation (16) as a path metric. Then, an arrangement may be made such that the path selector 163 selects the minimum value of path metrics while the intermediate path processor 168 provides the paths not coincident with the path stored in the intermediate path memory 169 with extremely large values.

Further, the embodiment of FIG. 1A may calculate path metrics by use of the absolute value of the equation (17) in place of the quantity proportional to the logarithmic probability represented by the equation (17).

What is claimed is:

1. An equalizer, comprising:
 a memory to temporarily store values $y_n$ of a received signal that has passed through a transmission channel having an input response;
 filter means, connected to the memory, for maximizing the signal-to-noise ratio of the sample values $y_n$ temporarily stored in and outputted from the memory;
 Viterbi algorithm processor means, connected to the filter means, for estimating, in a single time slot or a plurality of symbol periods, a transmitted symbol sequence maximizing a path metric every plurality of parameters of an adaptive algorithm and outputting an estimate $EX_n$ of the transmitted symbol sequence maximizing the path metric; and
 channel estimator means for generating estimates of the impulse response of the transmission channel, the channel estimator means having an input port which receives sample values outputted by the memory means, another input port which receives either a training sequence SYNC or the estimate of the transmitted symbol sequence outputted by the Viterbi algorithm processor means, and an output port through which the estimates of the impulse response of the transmission channel are supplied to the Viterbi algorithm processor means, the channel estimator means including
  a plurality of delay elements connected in series to selectively receive the training sequence SYNC or the transmitted symbol sequence estimate $EX_n$,
  a plurality of multipliers, each responsive to an input or an output of an associated one of the delay elements,
  first adder means for adding outputs of the multipliers, second adder means for adding an output of said first adder means and a sample value outputted by the memory, thereby outputting an error sequence $e_n$, and computing means, connected to the second adder means, for using the adaptive algorithm to generate the estimate of the impulse response of the transmission channel in response to the error sequence $e_n$.

2. An equalizer in accordance with claim 1, wherein the adaptive algorithm used by the computing means is the Recursive Least Square algorithm, and wherein the channel estimator means estimates the impulse response of the transmission channel in a data or a control information symbol period of the received signal a plurality of times for every time slot or for every plurality of symbols by using a plurality of forgetting factors.

3. An equalizer in accordance with claim 1, wherein the adaptive algorithm used by the computing means is the Least Mean Square algorithm, and wherein the channel estimator means estimates the impulse response of the transmission channel in a data or a control information symbol period of the received signal a plurality of times for every time slot or for every plurality of symbols by using a plurality of correction coefficients.

4. An equalizer in accordance with claim 1, wherein the filter means comprises a matched filter.

5. An equalizer in accordance with claim 1, wherein said channel estimator means further comprises:

Kalman gain vector storing means for storing a vector of Kalman gains computed beforehand from a training sequence in a training period of the received signals; and multiplying means for multiplying a vector of Kalman gains at a time n in the training period stored in the Kalman gain vector storing means by the estimation error at said time n;

said channel estimator means adding in the training period an output of said multiplying means to the impulse response estimate of the transmission channel at a time $n-1$ to thereby produce an impulse response estimate of the transmission channel at the time n.

6. An equalizer in accordance with claim 1, wherein the plurality of parameters of the adaptive algorithm specify convergence speed.

7. An equalizer in accordance with claim 1, wherein said channel estimator means further comprises a delay circuit having a switchable bypass circuit, a plurality of additional multipliers, a plurality of registers, and a subtractor, and wherein the adaptive algorithm used by the computing means is the Recursive Least Square algorithm during a training period of the received signal and the Least Mean Square algorithm during a data period of said received signal.

8. An equalizer, comprising:

phase rotating means for receiving sample values of a received signal that has a phase and that has passed through a transmission channel having an impulse response, and for generating a compensated received signal by rotating the phase of the received signal on the basis of phase estimates, to thereby compensate for a phase fluctuation;

Viterbi algorithm processing means, connected to the phase rotating means and receiving the compensated received signal, for estimating a transmitted symbol according to the Viterbi algorithm on the basis of an impulse response estimate of the transmission channel to thereby output a transmitted symbol sequence estimate;

delaying means, connected to the phase rotating means, for delaying the compensated signal to provide a delayed signal;

channel estimating means, responsive to the delayed signal, for estimating the impulse response of the transmission channel and delivering the impulse response estimate to the Viterbi algorithm processing means; and phase estimating means for generating the phase estimates and supplying them to the phase rotating means, the phase estimating means including phase error detecting means, connected to the delaying means and the channel estimating means, for outputting a phase error signal $\Delta\phi_n$ produced therein, loop filter means, connected to the phase error detecting means and having integrating means, for producing a phase correction amount $\Delta E\phi_{n+1}$, and voltage controlled oscillator means, connected to the loop filter means, for producing a phase estimate $E\phi_{n+1}$ by adding the phase correction amount $\Delta E\phi_{n+1}$ to a prior phase estimate $E\phi_n$ and delivering the new phase estimate $E\phi_{n+1}$ to the phase rotating means.

9. An equalizer in accordance with claim 8, wherein the integrating means comprises a multiplier which receives the phase error signal, an adder connected to the multiplier, and a delay means connected to the adder.

10. An equalizer in accordance with claim 8, wherein the channel estimating means comprises:

received signal reconstructing means for computing an estimate of the received signal from the transmitted symbol sequence estimate and the impulse response estimate;

adaptive impulse response updating means for updating the impulse response estimate on the basis of an estimation error and the transmitted symbol sequence estimate according to an adaptive algorithm; and subtracting means for subtracting the estimate of the received signal from the delayed signal to generate the estimation error, the estimation error being applied to the adaptive impulse response updating means and the phase estimating means.

11. An equalizer in accordance with claim 10, wherein the phase error detecting means comprises:

a complex conjugate circuit connected to the delaying means for computing a complex conjugate from the delayed signal;

means for multiplying the complex conjugate by the estimation error to provide a multiplied conjugate; and an imaginary portion extracting section to produce an imaginary number portion from the multiplied conjugate.

12. An equalizer in accordance with claim 8, wherein the integrating means comprises adder means for adding first and second input signals to provide a sum signal, the first input signal to the adder means being proportional to the phase error signal and the second input signal to the adder means being a delayed sum signal.

13. An equalizer in accordance with claim 8, wherein said voltage controlled oscillator means comprises:

adding means, connected to the loop filter means, for adding the phase correction amount to the phase estimate to provide a sum signal; and means for delaying the sum signal to provide the phase estimate.

14. An equalizer in accordance with claim 11, wherein said phase error detecting means further comprises standardizing means for standardizing the delayed signal, the standardizing means including multiplying means connected to the delaying means and the complex conjugate circuit, averaging means connected to the standardizing means, and dividing means connected to the imaginary portion extracting section, the averaging means, and the integrating means.

15. A Viterbi algorithm processor, comprising:

branch metric computing means for computing, by defining a state of a partial sequence of a plurality of probable transmitted symbols which may have been transmitted at a time n as i (i=1, ..., M), branch metrics of probable state transitions from a plurality of states at a time n−1 to a state i at the time n;

path metric computing means for computing path metrics of a plurality of probable paths in the state i at the time n by using an output of said branch metric computing means and the path metrics at the time n−1;

path selecting means for comparing the path metrics produced by said path metric computing means to thereby select one of the plurality of paths having the largest probability as a path in the state i at the time n;

path history storing means for updating a path history of the path selected by said path selecting means in the state i at the time n and holding the updated path history;

path converging means for determining whether or not the path history stored in said path history storing means is coincident throughout all the states i to thereby produce estimates of transmitted symbols from the path history up to a time when said path history is coincident;

intermediate path storing means for calculating and storing a state at the time n−1 which should change into the state i at the time n when the transmitted symbol sequence of a known data sequence was transmitted, on the basis of the known data sequence; and intermediate path processing means for substituting, when the probable states at the time n−1 which may change into the state i at the time n do not coincide with a state stored in said intermediate path storing means, extremely small values for the path metrics computed by said path metric computing means and delivering said extremely small values to said path selecting means.

16. A Viterbi algorithm processor in accordance with claim 15, wherein said intermediate path processing means comprises:

comparing means for comparing a plurality of probable states at the time n−1 which may change into the state i at the time n with the state stored in said intermediate path storing means; and selecting means for replacing the path metrics of uncoincident states, as determined by said comparing means, computed by said path metric computing means with predetermined extremely small values and delivering said extremely small values to said path selecting means.

17. A Viterbi algorithm processor in accordance with claim 15, in combination with a memory to temporarily store sample values of a received signal that has passed through a transmission channel having an impulse response, filter means connected to the memory for maximizing the signal-to-noise ratio of the sample values and provide them to the Viterbi algorithm processor, and channel estimator means for generating estimates of the impulse response of the channel and providing them to the Viterbi algorithm processor.

* * * * *